US011289378B2

(12) United States Patent
Schneider et al.

(10) Patent No.: US 11,289,378 B2
(45) Date of Patent: Mar. 29, 2022

(54) METHODS FOR DICING SEMICONDUCTOR WAFERS AND SEMICONDUCTOR DEVICES MADE BY THE METHODS

(71) Applicant: Cree, Inc., Durham, NC (US)

(72) Inventors: Kevin Schneider, Cary, NC (US); Alexander Komposch, Morgan Hill, CA (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 16/440,063

(22) Filed: Jun. 13, 2019

(65) Prior Publication Data

US 2020/0395246 A1 Dec. 17, 2020

(51) Int. Cl.
| | |
|---|---|
| *H01L 21/78* | (2006.01) |
| *H01L 21/304* | (2006.01) |
| *H01L 21/268* | (2006.01) |
| *H01L 33/00* | (2010.01) |
| *H01L 29/66* | (2006.01) |

(52) U.S. Cl.
CPC .......... *H01L 21/78* (2013.01); *H01L 21/268* (2013.01); *H01L 21/304* (2013.01); *H01L 29/66431* (2013.01); *H01L 33/005* (2013.01)

(58) Field of Classification Search
None
See application file for complete search history.

(56) References Cited

U.S. PATENT DOCUMENTS

| 6,737,606 | B2 | 5/2004 | Peng et al. | |
|---|---|---|---|---|
| 6,821,867 | B2 * | 11/2004 | Matsuura | H01L 23/544 438/462 |
| 6,945,844 | B2 | 9/2005 | Hubbell, III | |
| 7,008,861 | B2 | 3/2006 | Andrews et al. | |
| 7,544,588 | B2 * | 6/2009 | Genda | B23K 26/0736 438/462 |
| 7,547,578 | B2 | 6/2009 | Agarwal et al. | |
| 7,642,113 | B2 * | 1/2010 | Kurosawa | B23K 26/40 438/33 |
| 7,892,949 | B2 * | 2/2011 | Abe | H01L 21/268 438/462 |
| 8,629,532 | B2 * | 1/2014 | Chen | H01L 21/78 257/622 |
| 8,704,273 | B2 | 4/2014 | Okamoto et al. | |

(Continued)

OTHER PUBLICATIONS

International Search Report and Written Opinion issued in PCT/US2020/037440, dated Sep. 18, 2020.

*Primary Examiner* — Andres Munoz
(74) *Attorney, Agent, or Firm* — BakerHostetler

(57) ABSTRACT

A method for forming semiconductor devices from a semiconductor wafer includes cutting a first surface of a semiconductor wafer to form a first region that extends partially through the semiconductor wafer and the first region has a bottom portion. The method further includes directing a beam of laser light to the semiconductor wafer such that the beam of laser light is focused within the semiconductor wafer between the first surface and the second surface thereof and the beam of laser light further cuts the semiconductor wafer by material ablation to form a second region aligned with the first region. A resulting semiconductor device is disclosed as well.

23 Claims, 13 Drawing Sheets

(56) References Cited

U.S. PATENT DOCUMENTS

| | | | |
|---|---|---|---|
| 8,809,120 B2* | 8/2014 | Miccoli | B23K 26/032 |
| | | | 438/113 |
| 9,570,352 B2* | 2/2017 | Brunnbauer | H01L 21/304 |
| 10,388,534 B2* | 8/2019 | Takenouchi | B23K 26/364 |
| 10,707,129 B2* | 7/2020 | Sugiya | H01L 21/78 |
| 2005/0035099 A1* | 2/2005 | Nakamura | B23K 26/40 |
| | | | 219/121.72 |
| 2005/0035100 A1* | 2/2005 | Genda | B23K 26/40 |
| | | | 219/121.72 |
| 2005/0101109 A1* | 5/2005 | Chin | H01L 21/67092 |
| | | | 438/464 |
| 2005/0130390 A1 | 6/2005 | Andrews et al. | |
| 2006/0040472 A1* | 2/2006 | Tamura | H01L 21/78 |
| | | | 438/460 |
| 2006/0169680 A1* | 8/2006 | Park | H01L 21/78 |
| | | | 219/121.68 |
| 2006/0205182 A1* | 9/2006 | Soejima | H01L 21/78 |
| | | | 438/460 |
| 2007/0042525 A1 | 2/2007 | Dimmler | |
| 2007/0066044 A1* | 3/2007 | Abe | H01L 23/3128 |
| | | | 438/612 |
| 2008/0047408 A1* | 2/2008 | Oba | H01L 21/78 |
| | | | 83/39 |
| 2010/0120228 A1* | 5/2010 | Saito | B23K 26/0604 |
| | | | 438/463 |
| 2012/0156816 A1* | 6/2012 | Okamura | B28D 5/0011 |
| | | | 438/33 |
| 2015/0367450 A1 | 12/2015 | Draxler | |

* cited by examiner

METHODS FOR DICING SEMICONDUCTOR WAFERS AND SEMICONDUCTOR DEVICES MADE BY THE METHODS

FIELD OF THE DISCLOSURE

The disclosure relates to fabrication of semiconductor devices. More particularly, the disclosure relates to a method and associated implements for dicing semiconductor wafers. Additionally, the disclosure relates to semiconductor devices made by a method for dicing semiconductor wafers.

BACKGROUND OF THE DISCLOSURE

Semiconductor devices are typically fabricated on a substrate that provides mechanical support for the devices during the fabrication process. Additionally, the substrate often contributes to the electrical performance of the semiconductor device, as well. Semiconductor device manufacturing typically involves fabrication of many semiconductor devices on a single substrate wafer. The semiconductor devices are formed on the substrate wafer by formation of thin layers of semiconductor materials, insulator materials, metal materials, and/or the like. Each of the resulting semiconductor devices on the substrate wafer define die.

After the die are formed, it is necessary to separate the individual die manufactured on the semiconductor wafer. Thereafter, the individual die can be mounted and encapsulated to form individual devices. The process of separating the individual die is sometimes referred to as "dicing" or "singulating" the semiconductor wafer.

Dicing a wafer into individual semiconductor devices is typically accomplished by one of a number of methods. One method of dicing a wafer involves mechanically sawing the semiconductor wafer with a blade to define an array of individually diced, square, rectangular, and other shaped devices.

However, utilizing a mechanical saw for dicing semiconductor wafers can result in non-uniform cuts. In particular, the non-uniform cuts may include defects that include chips, chip outs, cracks, tear outs, splinters, edge cracks, and the like. The defects can have a negative impact on the resulting semiconductor device. In some cases, a defect may extend into an active area of the semiconductor device resulting in failure or poor performance. For example, a non-uniform cut may include and/or cause a crack that may propagate into an active area of the semiconductor device resulting in failure or poor performance. Moreover, once a semiconductor is produced and passes operational tests, a crack may subsequently propagate during operation of the semiconductor due to thermal cycling experienced by the semiconductor chip.

Additionally, utilizing a mechanical saw for dicing semiconductor wafers typically requires the removal of one or more layers of the semiconductor. For example, metal layers may be formed on the semiconductor wafer and these layers may not be easily cut by the saw blade. The operation of the saw and, in particular, the saw blade may be hindered by the metal layers of the semiconductor. Accordingly, the semiconductor fabrication process usually includes an additional process of removing, or inhibiting, the metal layers along a cut line prior to cutting by the saw. This process may be referred to as forming dicing "streets". This additional fabrication process adds time and expense to semiconductor manufacturing. Moreover, removing the metal layers from the semiconductor may result in reduced performance of the semiconductor device for which the metal layer is utilized.

For example, a portion of a metal layer may be used to transfer heat and may be removed when forming streets and accordingly the ability of the semiconductor device to transfer heat may be diminished as a result of the street formation. As another example, a portion of a metal layer may be used for die attachment and may be removed when forming streets and accordingly the ability for die attachment of the semiconductor device may be diminished as a result of the street formation.

Other methods of dicing include "scribe-and-break" techniques. In these methods, one or more trenches or scribe lines are formed in a surface of the semiconductor wafer using a laser. The semiconductor wafer may then be subjected to a load sufficient to break the wafer into individual die. The scribe lines manifest as lines of weakness in the substrate wafer so that the wafer subsequently breaks along the scribe lines.

Utilizing the laser for dicing semiconductor wafers can result in defects and/or damage to the semiconductor wafer, weakening of the semiconductor wafer, generation of undesired materials, and the like. In particular, the associated heat from the laser may weaken the semiconductor devices. Additionally, operating the laser generates undesired materials such as slag, generation of undesired alloys from the materials of the semiconductor, molten material byproducts, melting of various layers of the semiconductor, and the like. The defects can have a negative impact on the resulting semiconductor and/or semiconductor performance.

Additionally, utilizing the laser for dicing semiconductor wafers typically also requires the removal of one or more layers of the semiconductor. For example, the metal layers may not be easily broken as part of the "scribe-and-break" process. In this regard, the metal layer may bend rather than break. Accordingly, the semiconductor fabrication process usually also includes the additional process of removing or inhibiting the metal layers along a cut line prior to breaking. This additional fabrication process adds time and expense to semiconductor manufacturing. Moreover, removing the metal layers from the semiconductor may result in reduced performance of the semiconductor device for which the metal layer is utilized as described above.

Accordingly, there is a need for an alternative solution to dicing semiconductor wafers that results in cleaner dicing, improved semiconductor performance, reduced manufacture time, reduced manufacture costs, and the like.

SUMMARY OF THE DISCLOSURE

One general aspect includes a method for forming semiconductor devices from a semiconductor wafer having a first surface and a second surface and including at least a first device region and a second device region, the method including: cutting a first surface of a semiconductor wafer to form a first region that extends partially through the semiconductor wafer and the first region has a bottom portion; and directing a beam of laser light to the semiconductor wafer such that the beam of laser light is focused within the semiconductor wafer between the first surface and the second surface thereof and the beam of laser light further cuts the semiconductor wafer by material ablation to form a second region aligned with the first region.

One general aspect includes a die including: a first surface, a second surface, and a device region; the die including a first region that extends partially between the first surface and the second surface along a periphery of the singulated die; and the die further including a second region between the first surface and the second surface along the periphery of the die and the first region is aligned with the second region, where the first region includes a saw cut region and the second region includes a laser ablated region.

One general aspect includes a method for forming semiconductor devices from a semiconductor wafer having a first surface and a second surface and including at least a first device region and a second device region, the method including: cutting a first surface of a semiconductor wafer to form a first region that extends partially through the semiconductor wafer; and directing a beam of laser light to the semiconductor wafer such that the beam of laser light is focused within the semiconductor wafer between the first surface and the second surface thereof and the beam of laser light further cuts the semiconductor wafer by material ablation to form a second region, where the directing a beam of laser light to the semiconductor wafer further includes directing the beam of laser light in the first region to form the second region.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
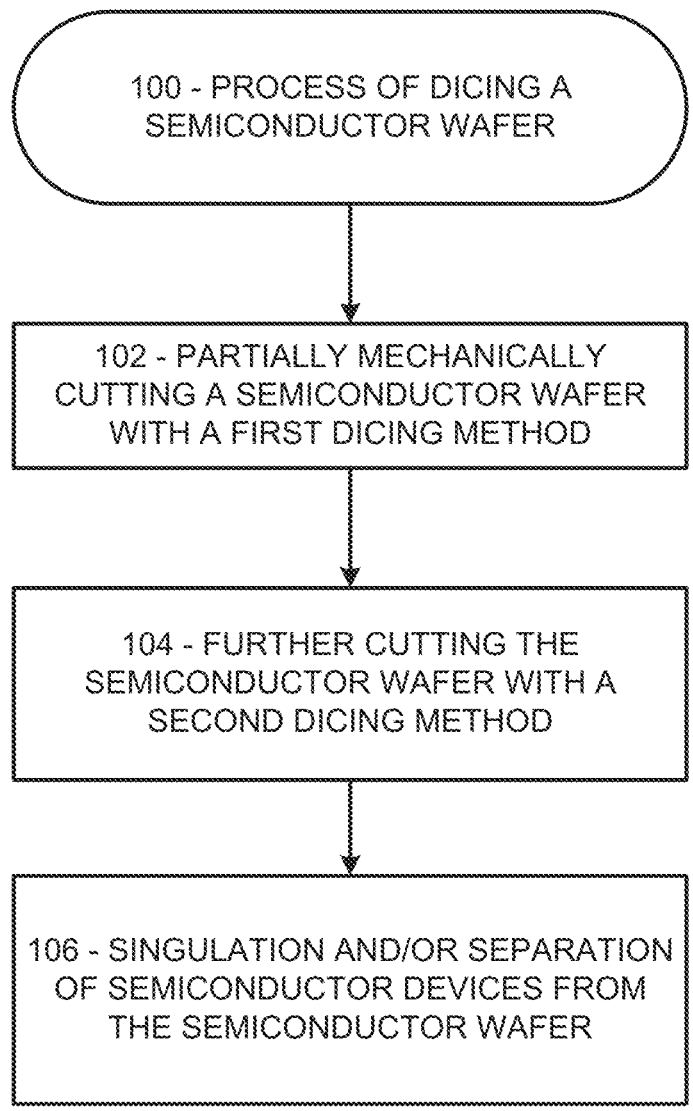
FIG. 1 illustrates a process of dicing a semiconductor wafer according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition to the type of structure, the characteristics of the semiconductor material from which a transistor is formed may also affect operating parameters. Of the characteristics that affect a transistor's operating parameters, the thermal conductivity may have an effect on a transistor's high frequency and high power characteristics.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the transistor generally decreases due to a decrease in carrier mobility with an increase in temperature. Therefore, if the heat is dissipated from the semiconductor, the material will remain at a lower temperature and be capable of carrying larger currents with lower leakage currents.

The disclosed process and device may be applied to semiconductor devices that may be mounted on a substrate. In some aspects, the substrate may be formed in the shape of a circular semiconductor wafer having a diameter ranging, for example, from less than 1 inch (2.54 cm) to over 12 inches (30.5 cm) depending on a type of material involved. Other semiconductor wafer shapes such as, for example, square, rectangular, triangular, and the like are possible; and other semiconductor wafer sizes are also possible.

The substrate may comprise, for example, silicon carbide (SiC), silicon (Si), germanium (Ge), gallium arsenide (GaAs), sapphire, gallium phosphide (GaP), gallium nitride (GaN), Zinc oxide (ZnO), alloys thereof, other materials suitable for the applications described herein, any other material capable of supporting growth of Group III-V materials, and the like. Materials may be deposited and patterned on the substrate to form semiconductor devices such as transistors, light emitting diodes (LEDs), diodes, solar cells, and other devices.

In one aspect, the semiconductor devices may be high-electron mobility transistors (HEMTs). In this regard, HEMTs may be Group III-Nitride based devices and such HEMTs are very promising candidates for high power radio frequency (RF) applications, for low frequency high power switching applications, as well as other applications. For example, the material properties of Group III-nitrides, such as GaN and its alloys, enable achievement of high voltage and high current, along with high RF gain and linearity for RF applications. A typical Group III-nitride HEMT relies on the formation of a two-dimensional electron gas (2DEG) at the interface between a higher band gap Group-III nitride (e.g., AlGaN) barrier layer and a lower band gap Group-III nitride material (e.g., GaN) buffer layer, where the smaller band gap material has a higher electron affinity. The 2DEG is an accumulation layer in the smaller band gap material and can contain a high electron concentration and high electron mobility.

In one aspect, the semiconductor devices may include light emitting diodes (LEDs). In this regard, continued developments in LEDs have resulted in highly efficient and mechanically robust light sources that can cover the visible spectrum as well as other light spectrums. These attributes, coupled with the potentially long service life of solid state devices, may enable a variety of new lighting applications, display applications, and the like. For example, GaN-based light emitting diodes (LEDs) may include an insulating, semiconducting, or conducting substrate such as sapphire, SiC, or the like on which a plurality of GaN-based epitaxial layers are deposited. The epitaxial layers may include an active region having a p-n junction that emits light when energized.

As used herein, the term "semiconductor wafer" refers to a wafer having at least one region of semiconductor material irrespective of whether a substrate of the wafer is a semiconductor material. For example, a layer of semiconductor material may be provided on a non-semiconductor material substrate to provide a semiconductor wafer. Furthermore, as used herein, the term "wafer" refers to a complete wafer or a portion of a wafer. Thus, the term wafer may be used to describe an entire wafer or part thereof.

FIG. 1 shows a process of dicing a semiconductor wafer according to the disclosure.

With reference to FIG. 1, in accordance with methods of the disclosure, multiple semiconductor devices formed on the same semiconductor wafer may be separated from one another utilizing a process of dicing a semiconductor wafer (Block 100) in accordance with the disclosure.

In particular, the process of dicing a semiconductor wafer (Block 100) may include partially mechanically cutting a semiconductor wafer with a first dicing method (Block 102).

In one aspect, the first dicing method (Block 102) may utilize a first implement that may be a mechanical saw. In one aspect, the first implement may be a circular saw. In one aspect, the first implement may be a saw device 1100 illustrated in FIG. 3 and/or illustrated in FIG. 11. In one aspect, the first implement may be any type of semiconductor wafer cutting mechanism. However, for brevity and ease of understanding, the first implement may be referred to as a saw device in the disclosure.

Additionally, partially mechanically cutting a semiconductor wafer with a first dicing method (Block 102) may include forming a first region that extends partially into the semiconductor wafer such that the first region includes a bottom portion. In other words, the first region does not extend all the way through the semiconductor wafer. In one aspect, the first region may be formed between and along adjacent edges of the semiconductor devices. In one aspect, the first region may be formed on a periphery of the semiconductor devices. In one aspect, the first region may be formed around a periphery of the semiconductor devices. In one aspect, the first region may be a first slot, a first channel, a first groove, a first trench, or the like. Further details of the partial mechanical cutting of the semiconductor wafer with the first dicing method (Block 102) are described herein.

Additionally, the process of dicing a semiconductor wafer (Block 100) may further include cutting the semiconductor wafer with a second dicing method (Block 104).

In one aspect, the second dicing method (Block 104) may utilize a second implement that may be a laser. In one aspect, the second implement may be a laser device 1200 illustrated in FIG. 4 and/or a laser device 1200 illustrated in FIG. 12. In one aspect, the second implement may be any type of semiconductor wafer cutting mechanism. However, for brevity and ease of understanding, the second implement may be referred to as a laser device in the disclosure.

Additionally, cutting the semiconductor wafer with a second dicing method (Block 104) may include utilizing a beam of laser light from a laser that may be directed into the semiconductor wafer such that a second region is formed between and along the adjacent edges of the semiconductor devices. In one aspect, the second region may be formed on a periphery of the semiconductor devices. In one aspect, the second region may be formed around a periphery of the semiconductor devices. In one aspect, the second region may be a second slot, a second channel, a second groove, a second trench, or the like. In one aspect, the first region and the second region may be arranged one above the other. In one aspect, the first region and the second region may be connected. In one aspect, the first region and the second region may be adjacent one another. In one aspect, the first region and the second region may be directly connected. In one aspect, partially mechanically cutting a semiconductor wafer with a first dicing method (Block 102) is performed prior to cutting the semiconductor wafer with a second dicing method (Block 104). In one aspect, partially mechanically cutting a semiconductor wafer with a first dicing method (Block 102) is performed after cutting the semiconductor wafer with a second dicing method (Block 104). In other words, the order of the dicing methods may be implemented in any particular order or simultaneously. Further details of cutting the semiconductor wafer with a second dicing method (Block 104) are described herein.

Next, the process of dicing a semiconductor wafer (Block 100) may further include singulation and/or separation of semiconductor devices from the semiconductor wafer (Block 106).

In one aspect, the combination of partially mechanically cutting a semiconductor wafer with a first dicing method (Block 102); and cutting the semiconductor wafer with a second dicing method (Block 104) results in a separation of the semiconductor devices. In one aspect, the combination results in a complete physical separation of the semiconductor devices. In one aspect, the combination of the first region and the second region results in a complete physical separation of the semiconductor devices. In one aspect, the combination of the first region and the second region extending entirely through the semiconductor wafer results in a complete physical separation of the semiconductor devices. Additionally, in some aspects the semiconductor wafer may be attached to a carrier medium before or during the process of dicing a semiconductor wafer (Block 100). In one aspect, the carrier medium may be a tape material. In one aspect, the tape material may include PVC, polyolefin, polyethylene, a backing material with an adhesive, and/or the like to hold the semiconductor wafer.

However, in alternative aspects the process of dicing a semiconductor wafer (Block 100) may result in an incomplete separation. In which case, the process of dicing a semiconductor wafer (Block 100) may further include singulating by breaking the wafer along the first region and/or the second region that together form a break line or break region. Such singulation may be accomplished using any suitable means or method. For example, the singulation may be effected by applying mechanical stresses in the wafer along the break line. In one aspect, the combination of partially mechanically cutting a semiconductor wafer with a first dicing method (Block 102) and cutting the semiconductor wafer with a second dicing method (Block 104) may result in a small portion of semiconductor wafer material remaining. This small portion of semiconductor wafer material may then be broken to finish the singulation process. The break can be facilitated by mounting the wafer on a flexible carrier substrate that facilitates the breaking of the semiconductor wafer as would be understood by one of skill in the art.

Figure 2:
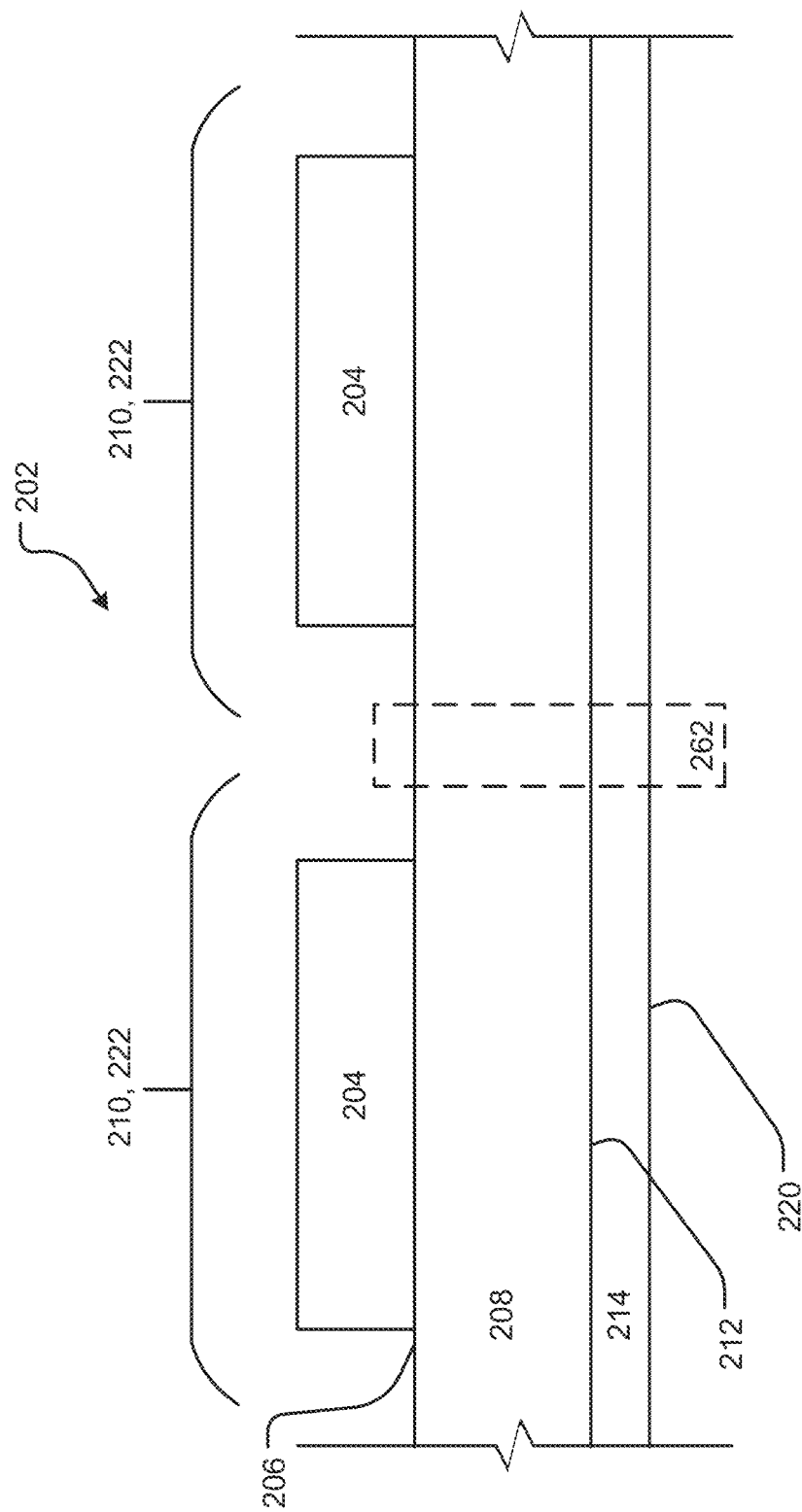
FIG. 2 illustrates a partial cross-sectional view of a semiconductor wafer prior to dicing according to aspects of the disclosure.

FIG. 2 illustrates a partial cross-sectional view of a semiconductor wafer prior to dicing according to aspects of the disclosure.

In particular, FIG. 2 illustrates an exemplary semiconductor wafer 202 that may be utilized with the process of dicing a semiconductor wafer (Block 100) of the disclosure. In this regard, the semiconductor wafer 202 of FIG. 2 is illustrated prior to implementation of the process of dicing a semiconductor wafer (Block 100) of the disclosure.

The semiconductor wafer 202 may include a plurality of active device portions 204 that may be formed on and/or in a first device surface 206 of the semiconductor wafer 202. In one aspect, the first device surface 206 may be an upper surface of the semiconductor wafer 202 or a top surface of the semiconductor wafer 202. Once the plurality of active device portions 204 are separated they may form semiconductor devices 222. Additionally, the active device portions 204 may further extend into the semiconductor wafer 202 (not shown), may be located in the semiconductor wafer 202 (not shown), or the like. In some aspects, the substrate 208 of the semiconductor wafer 202 may further include additional layers on the first device surface 206. In some aspects, the substrate 208 of the semiconductor wafer 202 may include no additional layers on the first device surface 206.

According to some aspects, the semiconductor wafer 202 may include a substrate 208. The substrate 208 may be formed of silicon carbide (SiC), silicon (Si), germanium (Ge), gallium arsenide (GaAs), sapphire, gallium phosphide (GaP), gallium nitride (GaN), Zinc oxide (ZnO), alloys thereof, other materials suitable for the applications described herein, any other material capable of supporting growth of Group III-V materials, and the like. In one aspect, the substrate 208 is formed of silicon carbide (SiC).

The plurality of active device portions 204 may cover respective regions 210 of the substrate 208. The respective regions 210 may result in the semiconductor device 222. In one aspect, the plurality of active device portions 204 may be configured to implement the semiconductor device 222 that may be one or more of transistors, Light Emitting Diodes (LEDs), diodes, solar cells, and other devices. In one aspect, the plurality of active device portions 204 may be configured to implement one or more transistors. In one aspect, the active device portions 204 may be configured to implement one or more HEMTs. In one aspect, the plurality of active device portions 204 may be configured to implement one or more Light Emitting Diodes (LEDs).

The substrate 208 of the semiconductor wafer 202 may further include a second device surface 212 arranged on an opposite side the substrate 208. In particular, the second device surface 212 may be arranged on a surface of the substrate 208 opposite the first device surface 206. In some aspects, the substrate 208 of the semiconductor wafer 202 may further include additional layers on the second device surface 212. In some aspects, the substrate 208 of the semiconductor wafer 202 may further include no additional layers on the second device surface 212. In one aspect, the second device surface 212 may define a bottom surface of the semiconductor wafer 202.

In some aspects, the additional layers may include device portions, contacts, layers, intervening layers, and the like. In one aspect, the additional layer may be a metallization layer 214. The metallization layer 214 may be arranged on the second device surface 212. In some aspects, the metallization layer 214 may provide thermal conductivity and/or die attachment for the resulting semiconductor devices 222. In aspects that include the additional layers, the additional layers may include a lower surface 220. In one aspect, the lower surface 220 may extend perpendicular to the substrate 208, the second device surface 212, and/or the first device surface 206. In one aspect, the lower surface 220 may define a bottom surface of the semiconductor wafer 202. Finally, the semiconductor wafer 202 may define a connecting portion 262 that connects the plurality of the active device portions 204, the respective regions 210, and/or the semiconductor devices 222 prior to separation of the same.

Figure 3:
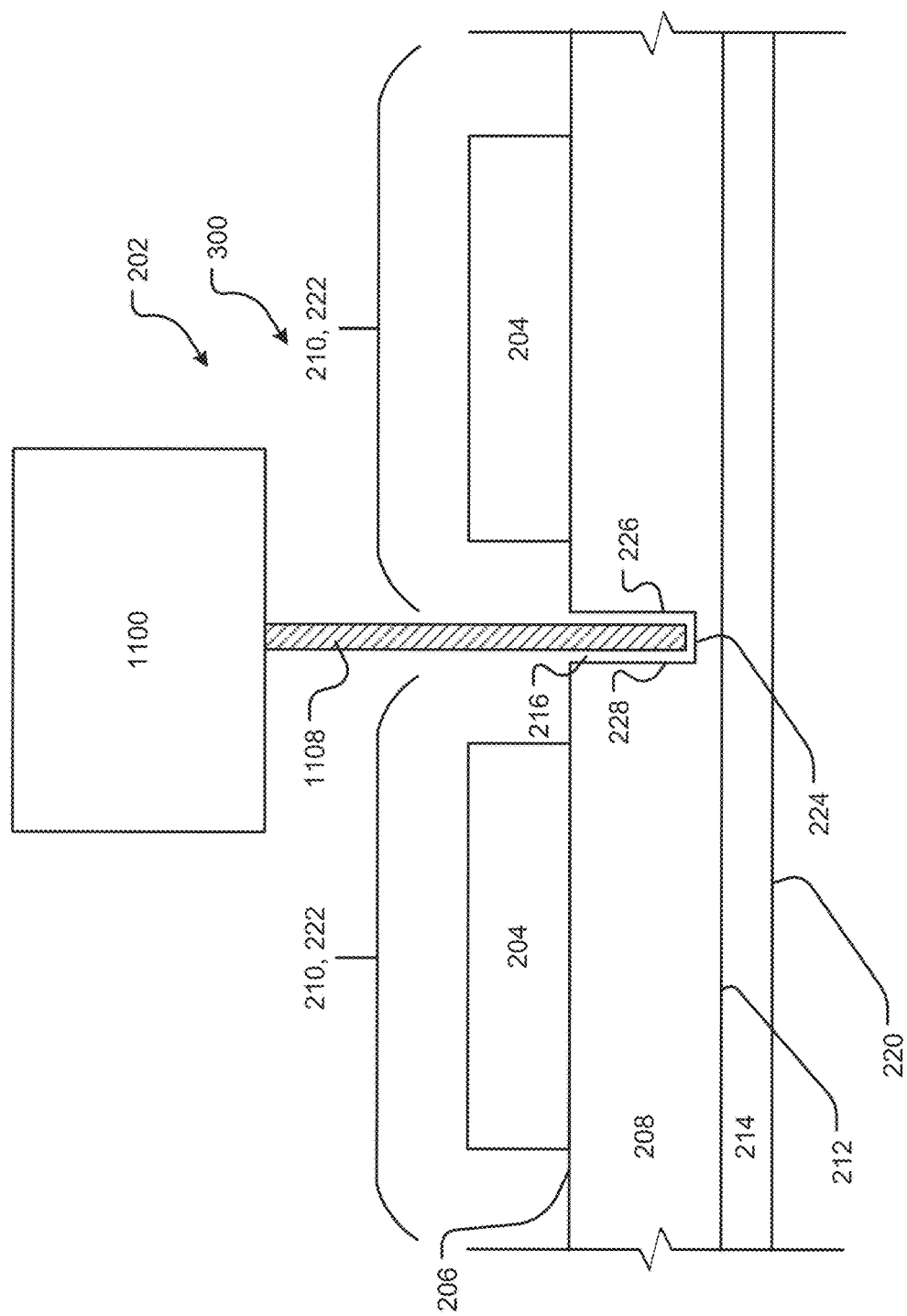
FIG. 3 illustrates a partial cross-sectional view of a semiconductor wafer during processing according to the disclosure.

FIG. 3 illustrates a partial cross-sectional view of a semiconductor wafer during processing according to the disclosure.

In particular, FIG. 3 illustrates the semiconductor wafer 202 during the process of dicing the semiconductor wafer (Block 100) that includes partially mechanically cutting the semiconductor wafer with the first dicing method (Block 102).

In one aspect, the first implement may be a saw device 1100 having a saw blade 1108. In one aspect, the saw device 1100 may be arranged above the semiconductor wafer 202 and the first device surface 206 to form a first region 216 in the first device surface 206. Additionally, partially mechanically cutting a semiconductor wafer with a first dicing method (Block 102) may include forming the first region 216 that extends partially into the semiconductor wafer 202 such that the first region 216 includes a bottom portion 224. In other words, the first region 216 may not extend through the semiconductor wafer 202. In one aspect, the first region 216 may be formed on a periphery of the semiconductor devices 222. In one aspect, the first region 216 may be formed around a periphery of the semiconductor devices 222. In one aspect, the first region 216 may be formed between and along the adjacent edges of the semiconductor devices 222. In one aspect, the first region 216 may be formed between and along the adjacent edges of the semiconductor devices 222 to have a first wall 226 and a second wall 228. In one aspect, the first region 216 may extend perpendicular to the first device surface 206 into the substrate 208. In one aspect, the first region 216 may extend from the first device surface 206 into the substrate 208. In one aspect, the first wall 226 and the second wall 228 may also extend perpendicular to the first device surface 206 into the substrate 208. In one aspect, the bottom portion 224 may extend parallel to the first device surface 206 within the substrate 208. In one aspect, the first region 216 may be a first slot, a first channel, a first groove, a first trench, or the like. In an alternative aspect, the first region 216 may extend from the second device surface 212 into the substrate 208; and the saw device 1100 may be arranged operationally for cutting below the semiconductor wafer 202 and the second device surface 212.

In this regard, by forming the first region 216 with the saw device 1100 that extends partially into the semiconductor wafer 202 such that the first region 216 includes a bottom portion 224 and/or the first region 216 does not extend through the semiconductor wafer 202 reduces the occurrence of non-uniform cuts that may include defects that include chips, chip outs, cracks, tear outs, splinters, edge cracks, and the like. In particular, it has been found that implementing the saw device 1100 to form a region that only partially extends through the semiconductor wafer 202 greatly reduces the above-noted non-uniform cuts and associated defects. More specifically, implementing the saw device 1100 to form a region that only partially extends through the semiconductor wafer 202 to greatly reduce the above-noted non-uniform cuts and associated defects was unexpected and these unexpected results provide numerous benefits as described herein including reduced defects, reduced manufacturing time, reduced manufacturing costs, and the like.

In one aspect, the process of dicing the semiconductor wafer (Block 100) that includes partially mechanically cutting the semiconductor wafer with the first dicing method (Block 102) includes forming the first region 216 in the first device surface 206, an upper surface of the semiconductor wafer 202, and/or a top surface of the semiconductor wafer 202. In this regard, the first implement and/or saw device 1100 may not be utilized to cut any metallic layers including the metallization layer 214. In this regard, the process of dicing a semiconductor wafer (Block 100) may not require the formation of streets. Accordingly, there may not be any need to etch any layers of the semiconductor wafer 202 for the process of dicing a semiconductor wafer (Block 100). Thus, the process of dicing a semiconductor wafer (Block 100) reduces defects, reduces semiconductor manufacturing time, and/or reduces semiconductor manufacturing expense.

In the foregoing manner, an intermediate substrate assembly 300 as shown in FIG. 3 is formed.

Figure 4:
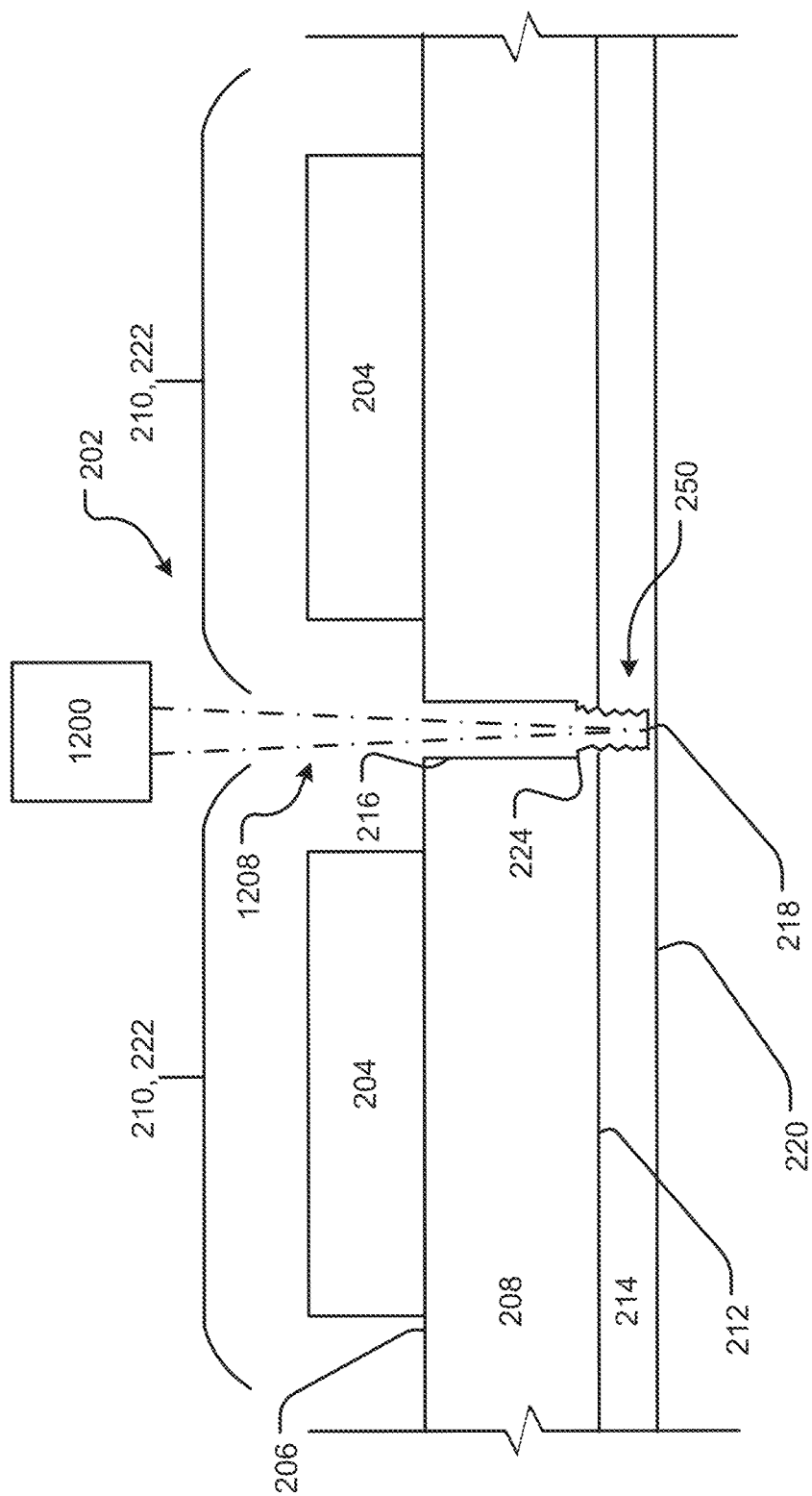
FIG. 4 illustrates a partial cross-sectional view of a semiconductor wafer during processing according to the disclosure.

FIG. 4 illustrates a partial cross-sectional view of a semiconductor wafer during processing according to the disclosure.

Figure 12:
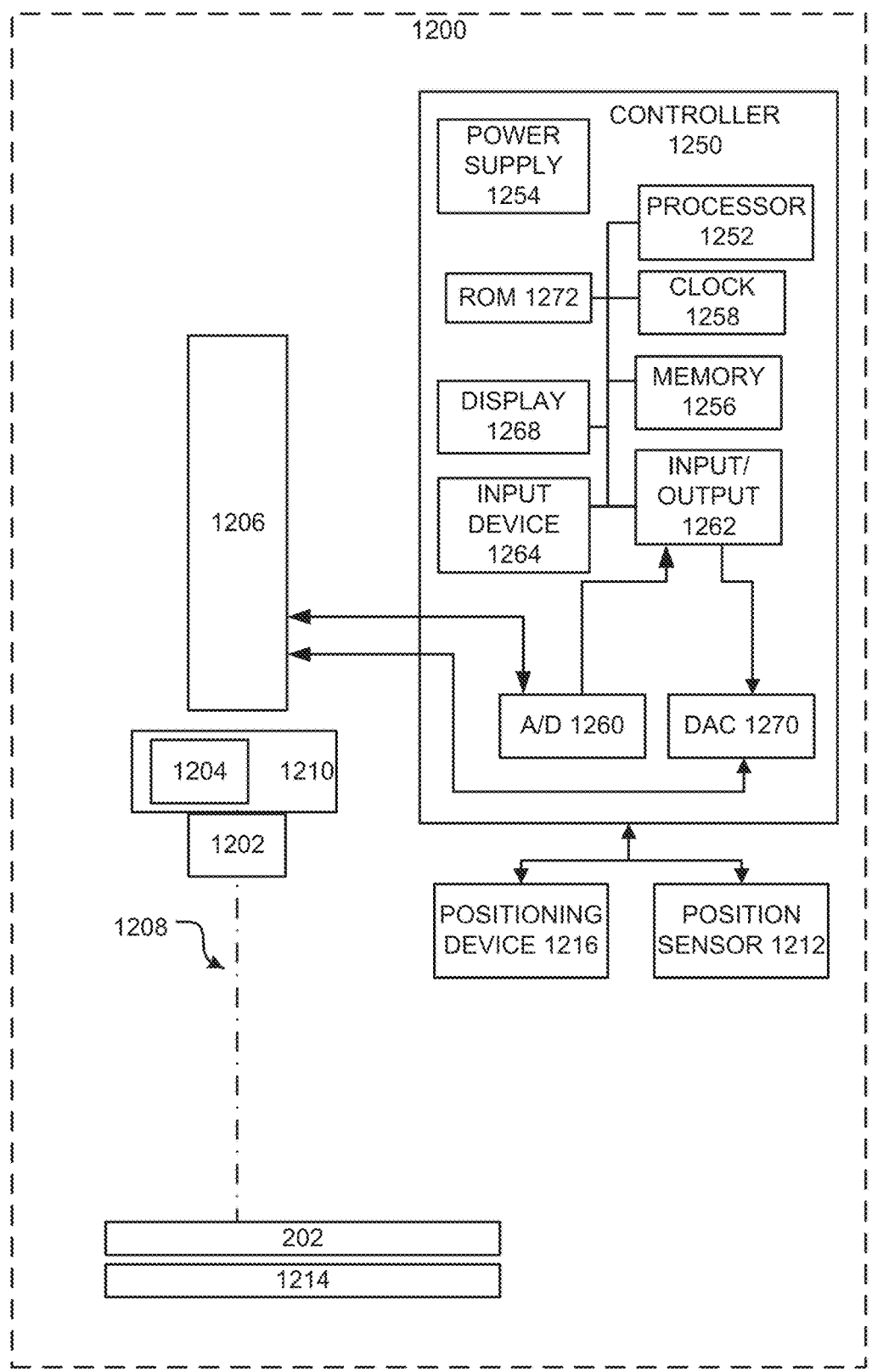
FIG. 12 illustrates a schematic of a laser cutting implement according to the disclosure.

FIG. 4 illustrates the semiconductor wafer 202 during the process of dicing the semiconductor wafer (Block 100) that includes cutting the semiconductor wafer with a second dicing method (Block 104). In particular, FIG. 4 illustrates a focused beam of laser light 1208 from a laser device 1200 may be directed into the semiconductor wafer 202 of the substrate 208 to create a second region 218 therein (Block 104; FIG. 1). In one aspect, the second region 218 may be formed on a periphery of the semiconductor devices 222. In one aspect, the second region 218 may be formed around a periphery of the semiconductor devices 222. In one aspect, the second region 218 may be a second slot, a second channel, a second groove, a second trench, or the like. In one aspect, the laser device 1200 may be arranged for operation above the semiconductor wafer 202 and the first device surface 206. The focused beam of laser light 1208 may be converged and focused by a lens 1202 (FIG. 12). The focused beam of laser light 1208 may be scanned (by relatively moving the laser device 1200, the semiconductor wafer 202, or both) across the semiconductor wafer 202 between the plurality of active device portions 204 such that the focused beam of laser light 1208 projects through the first region 216.

In one aspect, the focused beam of laser light 1208 projects through the first region 216 to the bottom portion 224. In this manner, the second region 218 may be formed in a pattern so as to be substantially coextensive and aligned with the first region 216 as illustrated in FIG. 4. In one aspect, the first region 216 and the second region 218 may be arranged one above the other. In one aspect, the first region 216 and the second region 218 may be connected. In one aspect, the first region 216 and the second region 218 may be directly connected. In one aspect, an axis of the first region 216 and an axis the second region 218 may be aligned. In one aspect, an axis of the first region 216 and an axis the second region 218 may be adjacent. A controller 1250 (FIG. 12) may be provided to control the operation of the laser device 1200 and the relative movement between the focused beam of laser light 1208 and the semiconductor wafer 202. In an alternative aspect, the second region 218 may extend from the second device surface 212 into the substrate 208; and the laser device 1200 may be arranged below the semiconductor wafer 202 and the second device surface 212.

During the above-described scanning operations, the focused beam of laser light 1208 may be generated such that the focused beam of laser light 1208 has a focus 250 that may be located within the semiconductor wafer 202. In one aspect, the focus 250 is controlled to be between the first device surface 206 and the lower surface 220. In one aspect, the focus 250 is controlled to be between the first device surface 206 and the second device surface 212. In one aspect, the focus 250 is controlled to be between the bottom portion 224 and the lower surface 220. In one aspect, the focus 250 is controlled to be between the bottom portion 224 and the second device surface 212.

In one aspect, the focused beam of laser light 1208 is generated such the focus 250 is located within the substrate 208 and is moved from the bottom portion 224 to the second device surface 212. In one aspect, the focused beam of laser light 1208 is generated such the focus 250 is located within the substrate 208 and is moved from the bottom portion 224 to the lower surface 220 as material of the semiconductor wafer 202 is ablated. In particular, the focus 250 is moved during the formation of the second region 218 such that energy of the laser light 1208 provides an optimal cutting speed and quality. According to some aspects, the focused beam of laser light 1208 is substantially uniform across the width of the second region 218.

According to some aspects, the laser device 1200 may be implemented as a gas laser, a chemical laser, a metal-vapor laser, a solid-state laser, and/or a semiconductor laser. According to some aspects, the laser device 1200 may be an ultraviolet laser.

According to some aspects, the laser device 1200 may be controlled to output the beam of laser light 1208 at a particular power. In one aspect, the particular power of the laser device 1200 may be 1 watt-25 watts, 2 watts-12 watts, 2 watts-4 watts, 4 watts-6 watts, 6 watts-8 watts, 8 watts-10 watts, 10 watts-12 watts, 12 watts-14 watts, 14 watts-16 watts, 16 watts-18 watts, 18 watts-20 watts, 20 watts-22 watts, or 22 watts-25 watts. In one aspect, the particular power of the laser device 1200 may be varied within the above-noted ranges.

In one aspect, the process of dicing the semiconductor wafer (Block 100) that includes cutting the semiconductor wafer with a second dicing method (Block 104) includes forming the second region 218 by the laser device 1200 generating a laser light 1208 above the first device surface 206, an upper surface of the semiconductor wafer 202, and/or a top surface of the semiconductor wafer 202. In this regard, the second implement and/or laser device 1200 ablates any metallic layers including the metallization layer 214. In this regard, the process of dicing a semiconductor wafer (Block 100) may not require the formation of streets. Accordingly, there is no need to etch any layers of the semiconductor wafer 202 for the process of dicing a semiconductor wafer (Block 100). Thus, the process of dicing a semiconductor wafer (Block 100) reduces defects, reduces semiconductor manufacturing time, and/or semiconductor manufacturing expense.

In one aspect, the process of dicing the semiconductor wafer (Block 100) that includes cutting the semiconductor wafer with a second dicing method (Block 104) includes forming the second region 218 by the laser device 1200 generating a laser light 1208 toward the second device surface 212 and/or the lower surface 220. In this regard, both the second device surface 212 and/or the lower surface 220 are physically located further from the active device portions 204 then the first region 216. This physical separation reduces unwanted thermal damage to the active device portions 204.

Figure 5:
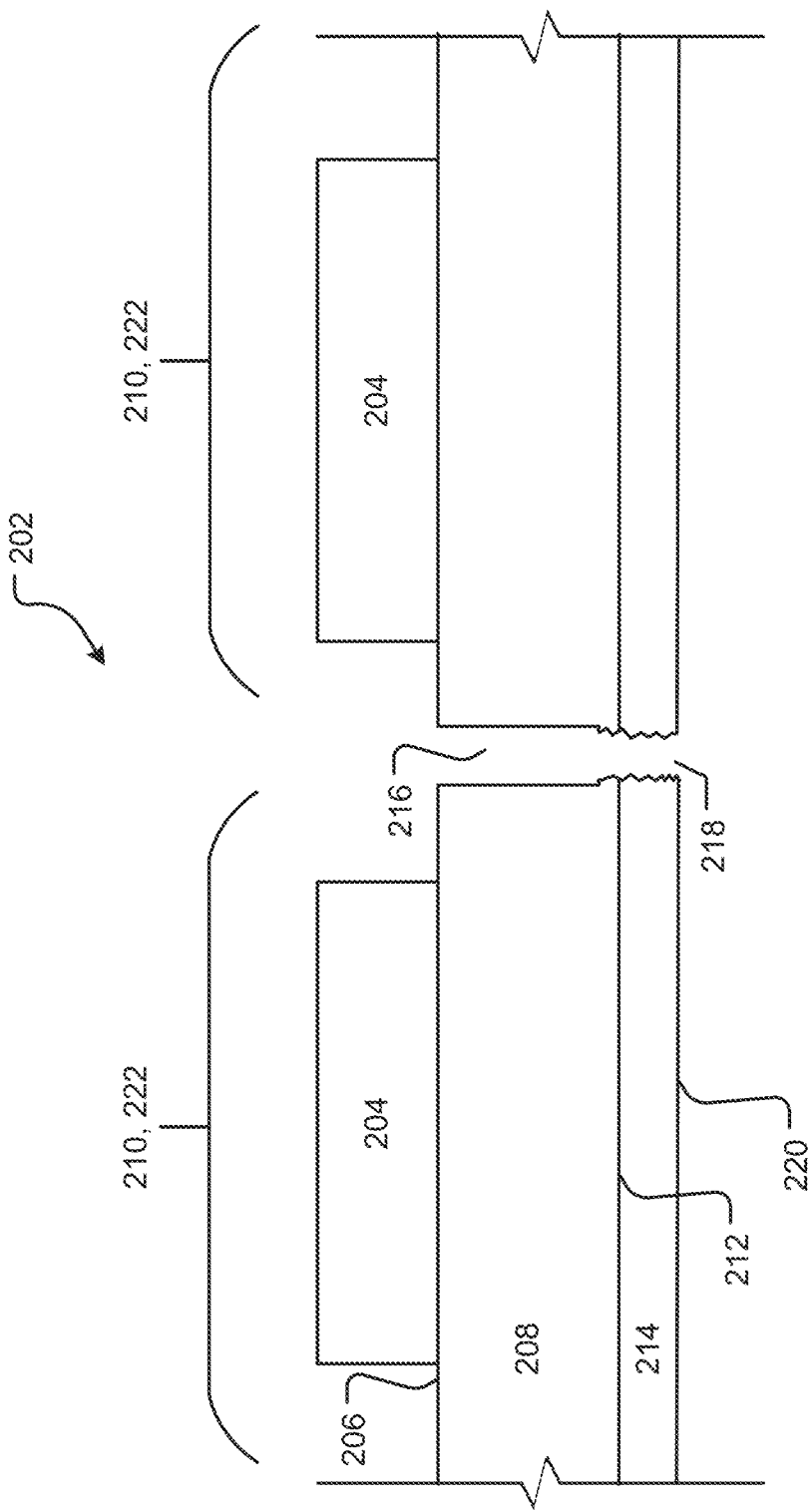
FIG. 5 illustrates a partial cross-sectional view of a semiconductor wafer after initial processing according to the disclosure.

FIG. 5 illustrates a partial cross-sectional view of a semiconductor wafer after initial processing according to the disclosure.

In particular, FIG. 5 illustrates the semiconductor wafer 202 after formation of the second region 218. In this regard, the second region 218 may be formed in the substrate 208 between the plurality of active device portions 204 by ablating a portion of the substrate 208, a portion of the metallization layer 214, and any other layers of the semiconductor wafer 202 located along the second region 218.

In particular, operation of the laser device 1200 may include internal ablation of materials of the semiconductor wafer 202, ablation of substrate material of the substrate 208 within the second region 218, ablation of material of the metallization layer 214 within the second region 218, and/or ablation of materials of any other layers within the second region 218.

The ablated material may escape from a lower opening of the second region 218 of the semiconductor wafer 202, may redeposit, or flow to relocate and remain within the semiconductor wafer 202. In one aspect, the ablation may include melting or vaporizing the semiconductor wafer 202 materials. For example, the ablation may include melting or vaporizing single crystalline SiC, vaporization of crystal boundaries, and/or the like. In this regard, additional layers of the semiconductor wafer 202 may also be ablated including the metallization layer 214. In one aspect, the material may be fully ablated from the second region 218 such that the material is removed and the remaining surface defines the second region 218 that together with the first region 216 may be open from the first device surface 206, to the second device surface 212 and/or to the lower surface 220.

In the foregoing manner, the semiconductor devices 222 as shown in FIG. 5 are formed.

Figure 6:
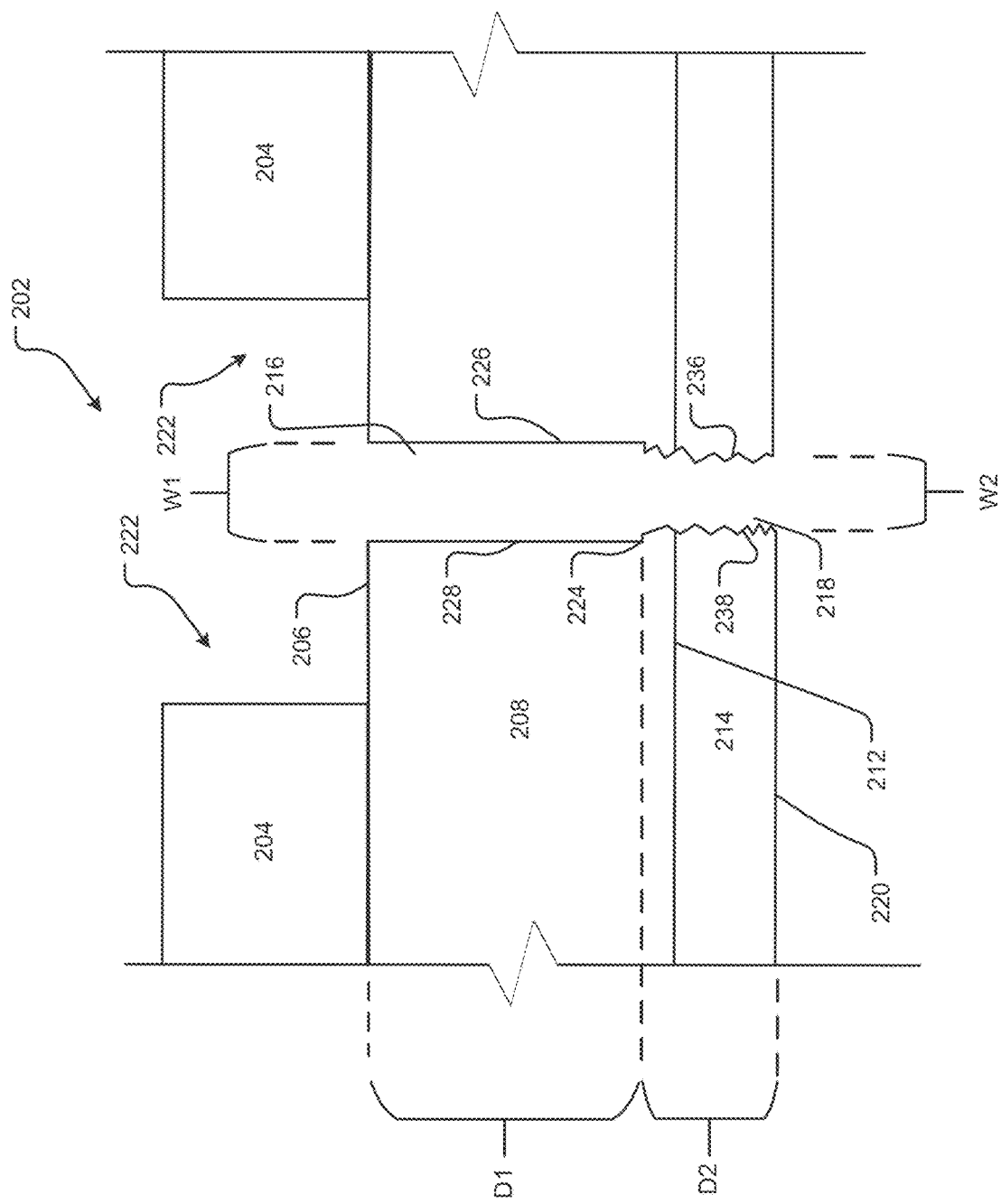
FIG. 6 illustrates a partial detailed cross-sectional view of a semiconductor wafer after initial processing according to FIG. 5.

FIG. 6 illustrates a detailed cross-sectional view of a partial semiconductor wafer after initial processing according to FIG. 5.

In particular, FIG. 6 illustrates that the first region 216 formed by the saw device 1100 may have a width W1 between the first wall 226 and the second wall 228; and the first region 216 formed by the saw device 1100 may have a depth D1 between the first device surface 206 and the bottom portion 224. In some aspects, the width W1 may have a range of 20 μm-100 μm, 20 μm-25 μm, 25 μm-30 μm, 30 μm-40 μm, 40 μm-50 μm, 50 μm-60 μm, 60 μm-70 μm, 70 μm-80 μm, 80 μm-90 μm, or 90 μm-100 μm.

In some aspects, the depth D1 may have a range of 5 μm-150 μm, 5 μm-10 μm, 10 μm-15 μm, 15 μm-20 μm, 20 μm-25 μm, 25 μm-30 μm, 30 μm-40 μm, 40 μm-50 μm, 50 μm-60 μm, 60 μm-70 μm, 70 μm-80 μm, 80 μm-90 μm, 90 μm-100 μm, 100 μm-110 μm, 110 μm-120 μm, 120 μm-130 μm, 130 μm-140 μm, or 140 μm-150 μm.

In some aspects, the depth D1 may be equal to 50% to 99%, 50% to 60%, 60% to 70%, 70% to 80%, 80% to 90%, 90% to 99%, of a combined thickness of the substrate 208, a thickness of the metallization layer 214, and a thickness of any additional layers or intervening layers associated with the semiconductor wafer 202. In some aspects, the depth D1 may be greater than 30%, 40%, 50%, 60%, 70%, 80%, or 90% of a combined thickness of the substrate 208, a thickness of the metallization layer 214, and a thickness of any additional layers or intervening layers associated with the semiconductor wafer 202.

In some aspects, the depth D1 may be equal to 50% to 99%, 50% to 60%, 60% to 70%, 70% to 80%, 80% to 90%, 90% to 99%, of a combined thickness of the substrate 208 and a thickness of any additional or intervening layers associated with the semiconductor wafer 202. In some aspects, the depth D1 may be greater than 30%, 40%, 50%, 60%, 70%, 80%, or 90% of a combined thickness of the substrate 208 and a thickness of any additional or intervening layers associated with the semiconductor wafer 202.

In some aspects, the depth D1 may be equal to 50% to 99%, 50% to 60%, 60% to 70%, 70% to 80%, 80% to 90%, 90% to 99%, of a thickness of the substrate 208 associated with the semiconductor wafer 202. In some aspects, the depth D1 may be greater than 30%, 40%, 50%, 60%, 70%, 80%, or 90% of a thickness of the substrate 208 associated with the semiconductor wafer 202.

In some aspects, the depth D1 may be equal to 50% to 99%, 50% to 60%, 60% to 70%, 70% to 80%, 80% to 90%, 90% to 99%, of a thickness of the semiconductor wafer 202. In some aspects, the depth D1 may be greater than 30%, 40%, 50%, 60%, 70%, 80%, or 90% of a thickness of the semiconductor wafer 202.

FIG. 6 further illustrates that the second region 218 formed by the laser device 1200 may have a width W2 between the first wall 236 and the second wall 238; and the second region 218 formed by the laser device 1200 may have a depth D2 between the bottom portion 224 and the second device surface 212 and/or the lower surface 220. In some aspects, the width W2 may have a range of 5 µm-100 µm, 5 µm-10 µm, 10 µm-15 µm, 15 µm-20 µm, 20 µm-25 µm, 25 µm-30 µm, 30 µm-40 µm, 40 µm-50 µm, 50 µm-60 µm, 60 µm-70 µm, 70 µm-80 µm, 80 µm-90 µm, or 90 µm-100 µm.

In some aspects, the depth D2 may have a range of 5 µm-100 µm, 5 µm-10 µm, 10 µm-15 µm, 15 µm-20 µm, 20 µm-25 µm, 25 µm-30 µm, 30 µm-40 µm, 40 µm-50 µm, 50 µm-60 µm, 60 µm-70 µm, 70 µm-80 µm, 80 µm-90 µm, or 90 µm-100 µm.

In some aspects, the combined depth D2 and depth D1 may be equal to a combined thickness of the substrate 208, a thickness of the metallization layer 214, and a thickness of any additional or intervening layers associated with the semiconductor wafer 202. In some aspects, the combined depth D2 and depth D1 may be equal to a thickness of the semiconductor wafer 202. In some aspects, the combined depth D2 and depth D1 may be equal to 80% to 100%, 80% to 85%, 85% to 95%, 95% to 98%, 98% to 99%, 99% to 100%, of a combined thickness of the substrate 208, a thickness of the metallization layer 214, and a thickness of any additional or intervening layers associated with the semiconductor wafer 202. In some aspects, the combined depth D2 and depth D1 may be equal to 80% to 100%, 80% to 85%, 85% to 95%, 95% to 98%, 98% to 99%, 99% to 100%, of a thickness of the semiconductor wafer 202.

In some aspects, the combined depth D2 and depth D1 may be equal to a thickness of the substrate 208 and a thickness of the metallization layer 214. In some aspects, the width W1 may be greater than the width W2. As the width W1, the width W2, the depth D1, and the depth D2 may vary from device to device and location to location, each of these values may represent an average or mean value in various aspects consistent with the disclosure.

Figure 7:
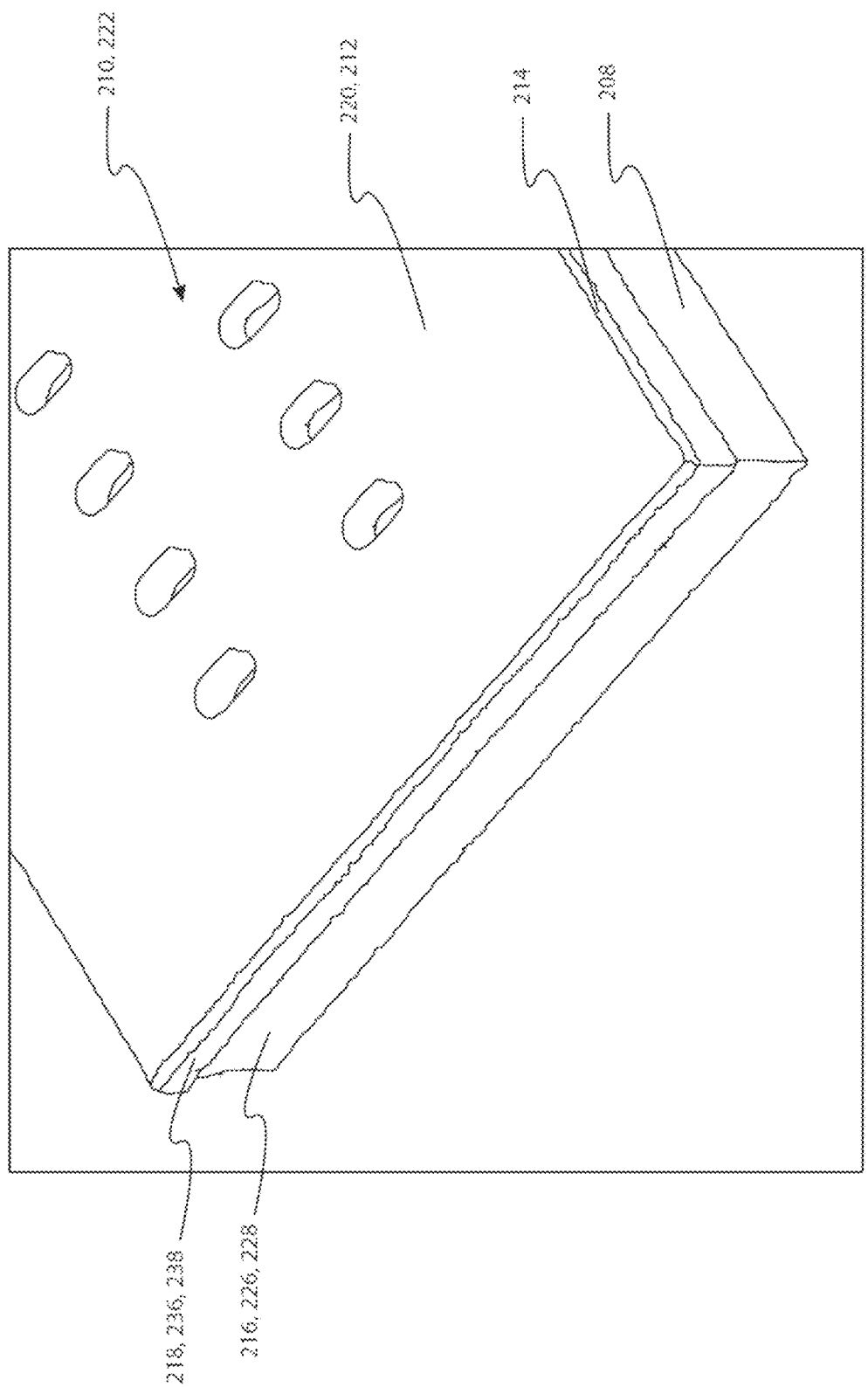
FIG. 7 illustrates a partial perspective view of a semiconductor wafer after initial processing according to the disclosure.

FIG. 7 illustrates a partial perspective view of a semiconductor wafer after initial processing according to the disclosure.

In particular, FIG. 7 illustrates a semiconductor device 222 after the process of dicing a semiconductor wafer (Block 100 of FIG. 1) as well as after the process of singulation and/or separation of semiconductor devices from the semiconductor wafer (Block 106). More specifically, as illustrated in FIG. 7, details of the back side or the lower surface 220/the second device surface 212 of semiconductor device 222 are shown. Additionally, a surface of the second region 218 as well as the first wall 236/the second wall 238 of the second region 218 are illustrated; and a surface of the first region 216 as well as the first wall 226/the second wall 228 of the first region 216 are illustrated.

In particular, FIG. 7 illustrates that the process of dicing a semiconductor wafer (Block 100 of FIG. 1) according to the disclosure includes no apparent defects or at least a reduced density of defects. In this regard, FIG. 7 moreover illustrates that the process of dicing a semiconductor wafer (Block 100 of FIG. 1) according to the disclosure provide the unexpected results of utilizing the disclosed process such that there includes no apparent defects or at least a reduced density of defects.

Figure 8:
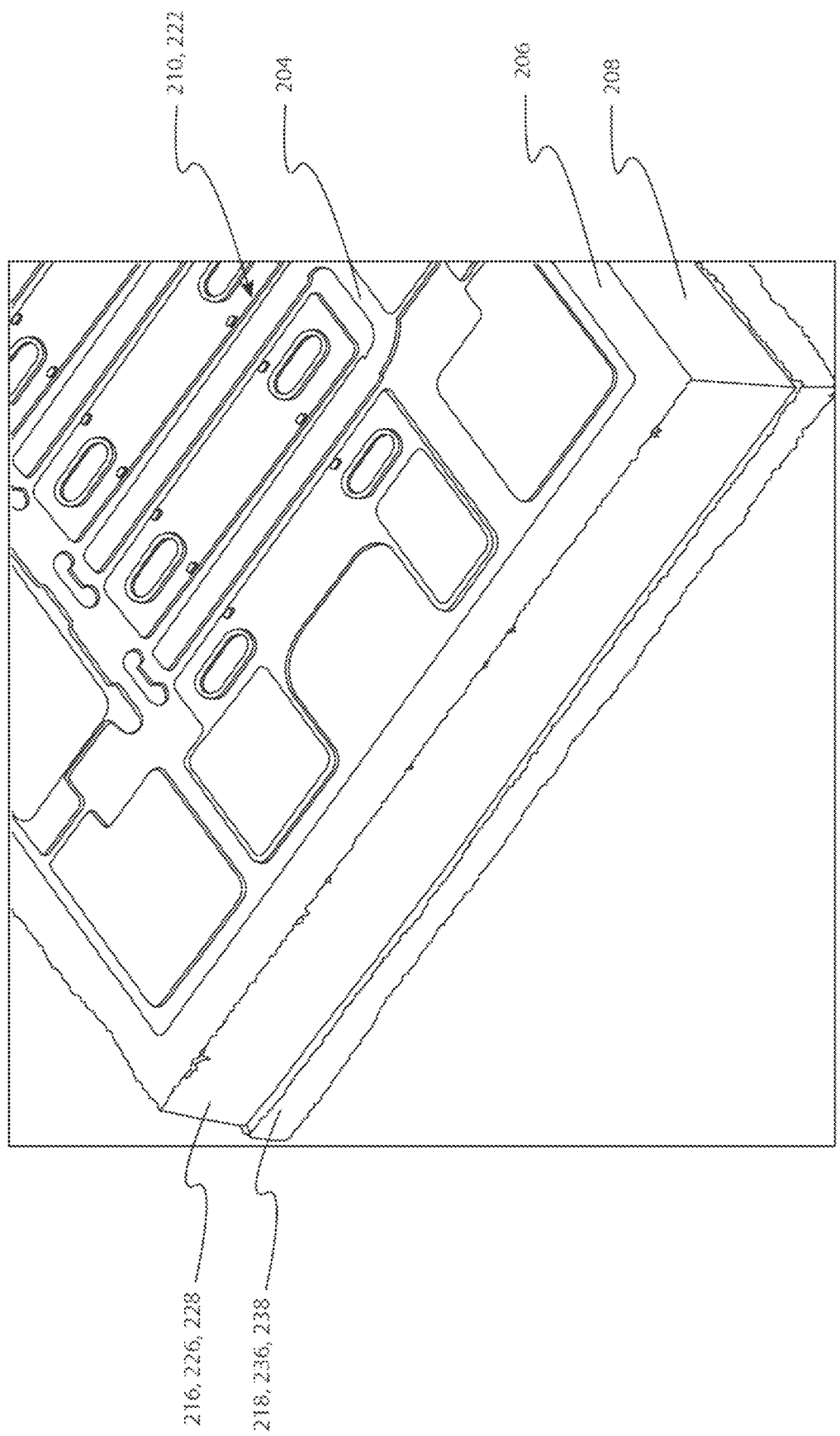
FIG. 8 illustrates a partial perspective view of a semiconductor wafer after initial processing according to the disclosure.

FIG. 8 illustrates a partial perspective view of a semiconductor wafer after initial processing according to the disclosure.

In particular, FIG. 8 illustrates a semiconductor device 222 after the process of dicing a semiconductor wafer (Block 100 of FIG. 1) as well as after the process of singulation and/or separation of semiconductor devices from the semiconductor wafer (Block 106). More specifically, as illustrated in FIG. 8, details of the front side or the first device surface 206 and at least one of the plurality of active device portions 204 of the semiconductor device 222 are shown. Additionally, a surface of the second region 218 as well as the first wall 236/the second wall 238 of the second region 218 are illustrated; and a surface of the first region 216 as well as the first wall 226/the second wall 228 of the first region 216 are illustrated.

In particular, FIG. 8 illustrates that the process of dicing a semiconductor wafer (Block 100 of FIG. 1) according to the disclosure includes no apparent defects or at least a reduced density of defects. In this regard, FIG. 8 moreover illustrates that the process of dicing a semiconductor wafer (Block 100 of FIG. 1) according to the disclosure provide the unexpected results of utilizing the disclosed process such that there includes no apparent defects or at least a reduced density of defects.

Figure 9:
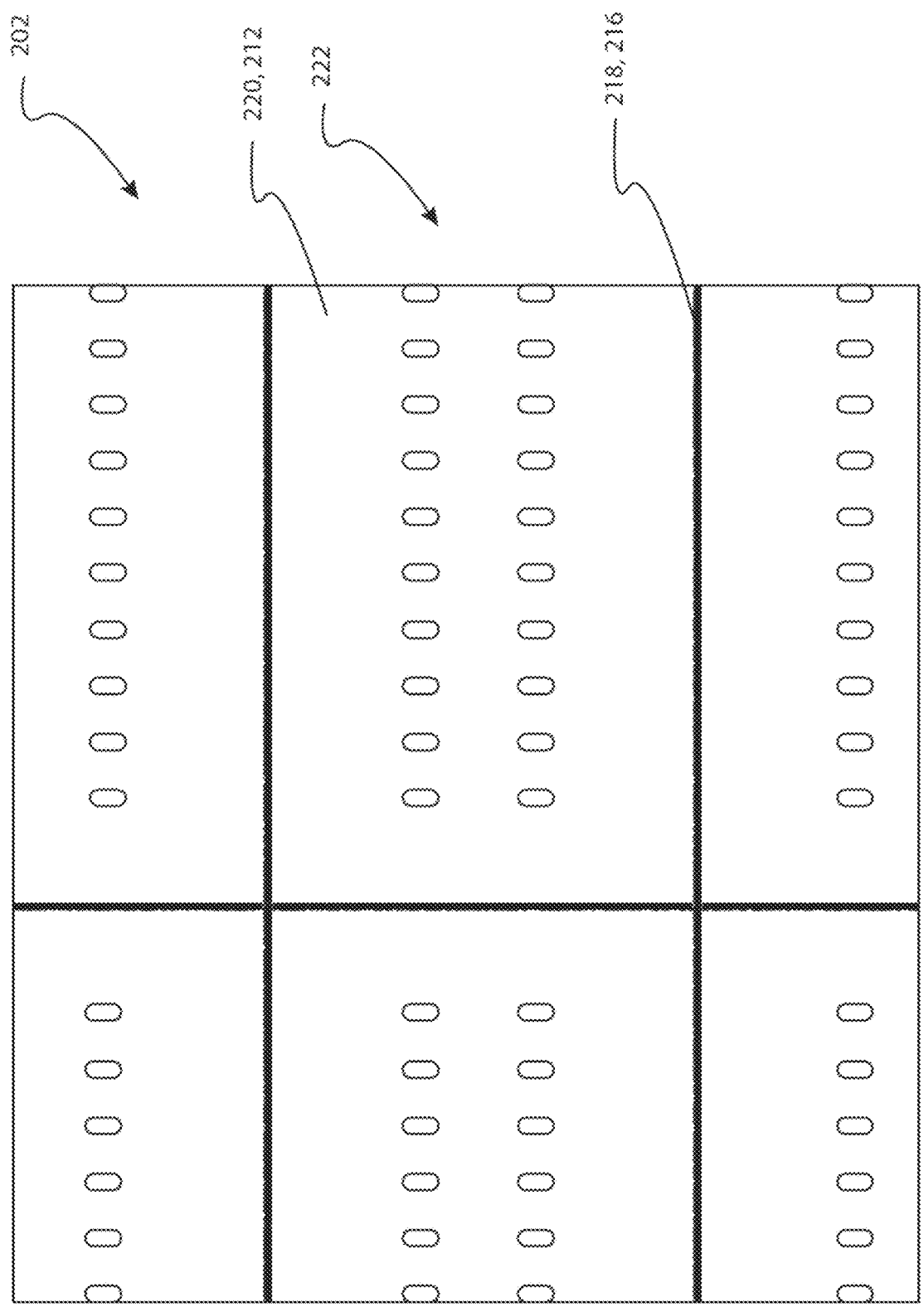
FIG. 9 illustrates a bottom view of a semiconductor wafer after initial processing according to the disclosure.

FIG. 9 illustrates a bottom view of a semiconductor wafer after initial processing according to the disclosure.

In particular, FIG. 9 illustrates a semiconductor device 222 after the process of dicing a semiconductor wafer (Block 100 of FIG. 1) prior to singulation and/or separation of semiconductor devices from the semiconductor wafer. More specifically, as illustrated in FIG. 9, details of the back side or the lower surface 220/the second device surface 212 of semiconductor device 222 are shown. Additionally, the second region 218 and the first region 216 are illustrated.

In particular, FIG. 9 illustrates that the process of dicing a semiconductor wafer (Block 100 of FIG. 1) according to the disclosure includes no apparent defects or at least a reduced density of defects. In this regard, FIG. 9 moreover illustrates that the process of dicing a semiconductor wafer (Block 100 of FIG. 1) according to the disclosure provide the unexpected results of utilizing the disclosed process such that there includes no apparent defects or at least a reduced density of defects.

Figure 10:
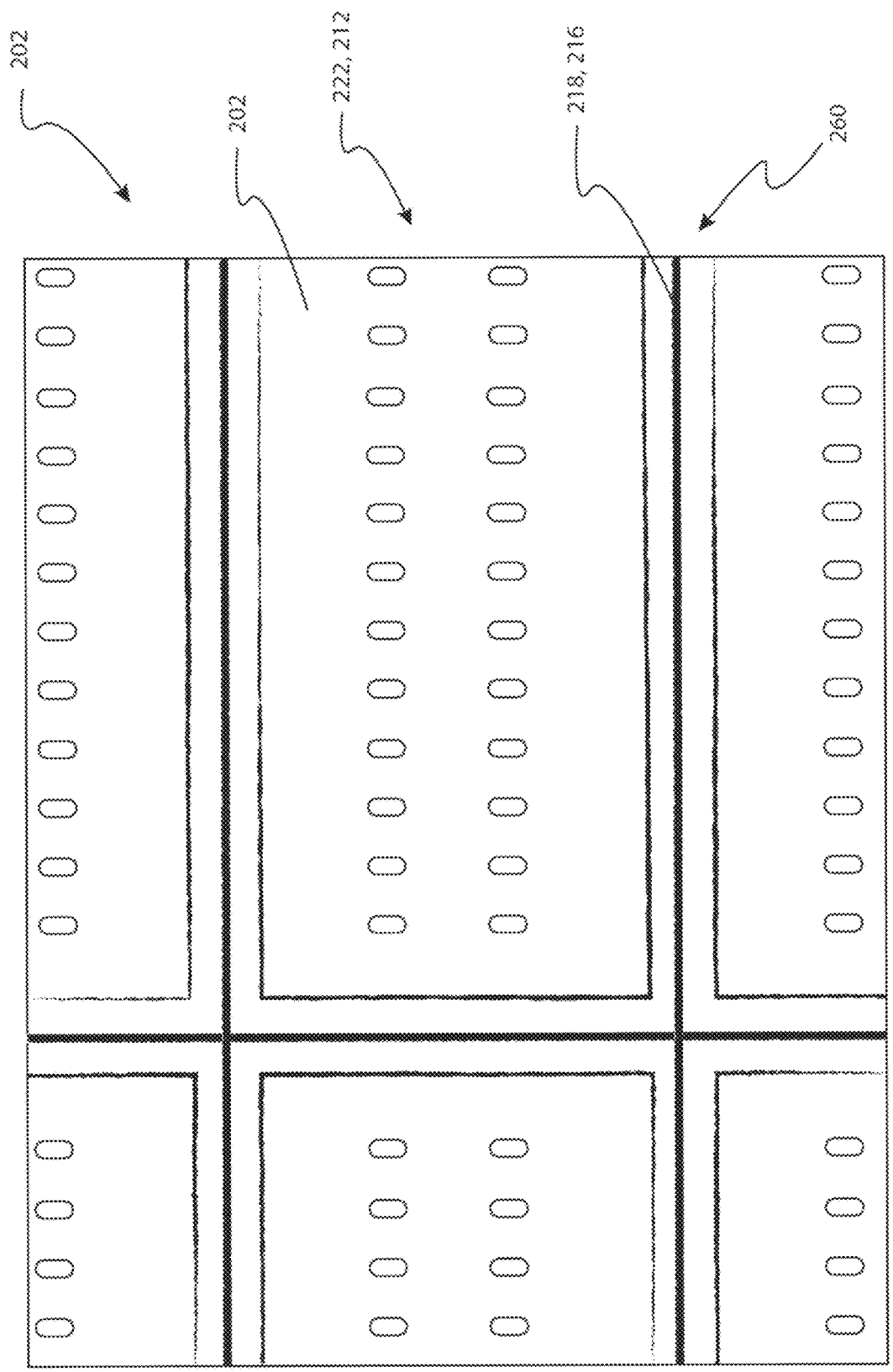
FIG. 10 illustrates a bottom view of a semiconductor wafer after initial processing according to the disclosure.

FIG. 10 illustrates a bottom view of a semiconductor wafer after initial processing according to the disclosure.

In some aspects of the disclosure, the plurality of active device portions 204 need no formation street structures. However, in some cases, the street structures may still be utilized. In this regard, FIG. 10 illustrates an aspect where the plurality of active device portions 204 may be separated by at least one street structure 260. According to some aspects, the lower surface 220 may be etched fully down to the second device surface 212 of the substrate 208 so that an exposed strip of the second device surface 212 defines each street structure 260.

In particular, FIG. 10 illustrates that the process of dicing a semiconductor wafer (Block 100 of FIG. 1) according to the disclosure includes no apparent defects or at least a reduced density of defects. In this regard, FIG. 10 moreover illustrates that the process of dicing a semiconductor wafer (Block 100 of FIG. 1) according to the disclosure provide the unexpected results of utilizing the disclosed process such that there includes no apparent defects or at least a reduced density of defects.

Figure 11:
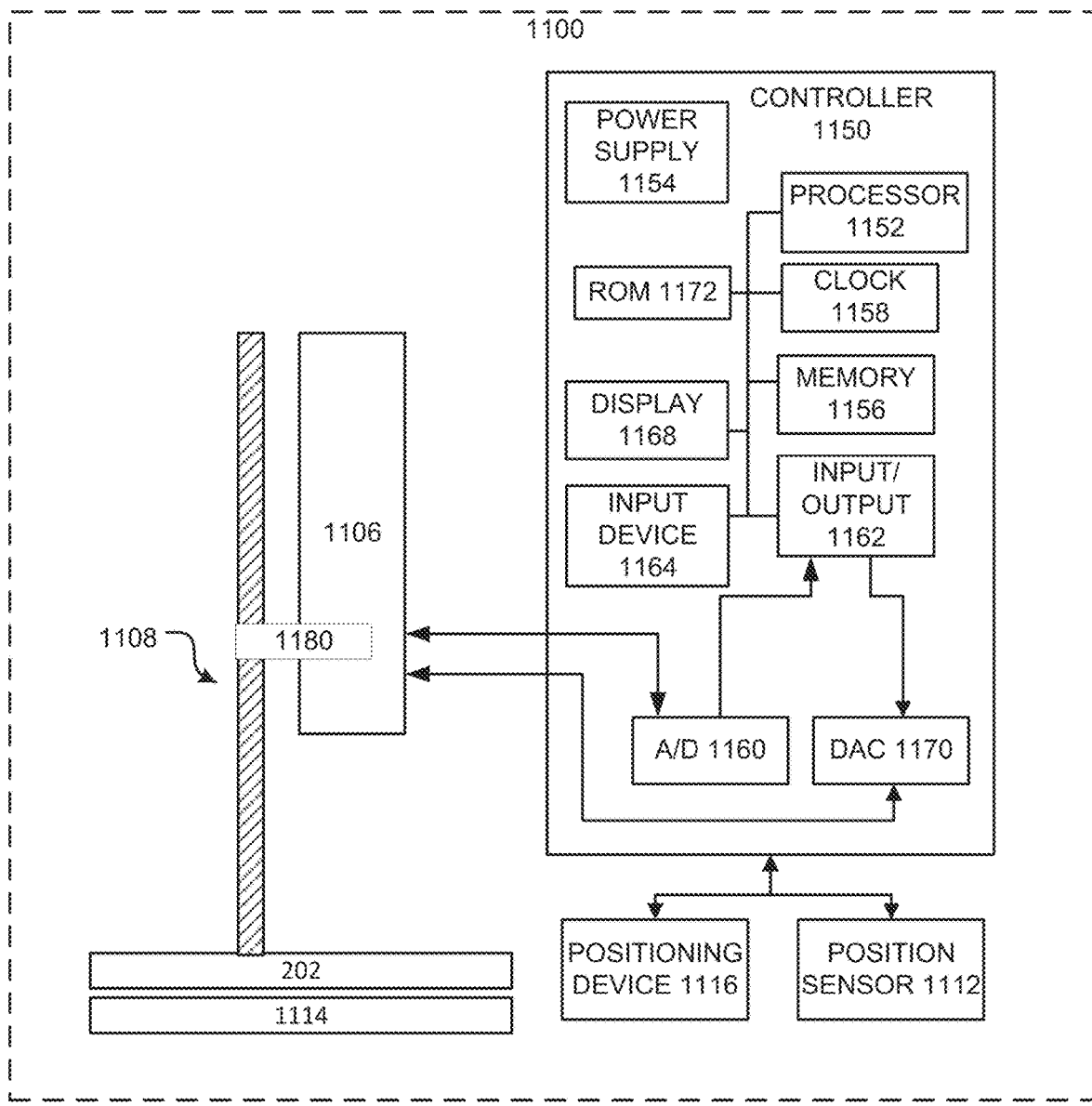
FIG. 11 illustrates a schematic of a saw cutting implement according to the disclosure.

FIG. 11 illustrates a schematic of a saw cutting device according to the disclosure.

The saw device 1100 illustrated in FIG. 11 may be implemented to produce the first region 216 in the semiconductor wafer 202. However, any type of semiconductor wafer cutting device may be utilized as well to produce the first region 216 in the semiconductor wafer 202. The saw device 1100 may cut the substrate 208 and/or any other additional layers of the semiconductor wafer 202 with a saw blade 1108. In one aspect, the saw blade 1108 may be a circular saw blade that is rotated by a motor 1106. The motor 1106 may include a motor shaft 1180 mounting the saw blade 1108 for driven rotation.

The saw device 1100 may cut with the saw blade 1108 in controlled patterns. The width and depth of the first region 216 may be controllable through pattern generation and saw settings on the saw device 1100. The saw device 1100 may have settings that include power, rotational speed, linear speed, repetitions, and/or the like. Geometry may be generated directly from computer aided design (CAD) files and imported into the saw device 1100. In other aspects, the saw device 1100 may alternatively or additionally utilize pattern recognition and/or a fixed pitch for cutting. The settings may be controlled by the saw device 1100 by hardware and/or software.

The saw device 1100 may include a controller 1150. The controller 1150 may receive sensor outputs from a position sensor 1112 that may sense a position of the semiconductor wafer 202 or any other components being processed by the saw device 1100. In one aspect, the position sensor 1112 may sense a position of a support 1114 that is supporting a part of the semiconductor wafer 202 or any other components being processed by the saw device 1100. The controller 1150 may move the support 1114 in order to form the first region 216 in the desired locations of the semiconductor wafer 202 or any other components being processed by the saw device 1100 with a positioning device 1116. The positioning device 1116 may include one or more positioning motors to position the support 1114 at the desired location. The positioning device 1116 may be implemented in numerous other ways. Alternatively, the positioning device 1116 may position the saw device 1100 and the position sensor 1112 may determine the position of the saw device 1100 while the support 1114 is stationary. In other aspects, both the saw device 1100 and the support 1114 may be moved.

The controller 1150 may include a processor 1152. This processor 1152 may be operably connected to a power supply 1154, a memory 1156, a clock 1158, an analog to digital converter (A/D) 1160, an input/output (I/O) port 1162, and the like. The processor 1152 may control the saw device 1100 to operate the saw blade 1108 to generate a width W1 and depth D1 of the first region 216 through pattern generation. The processor 1152 may control the saw device 1100 to operate the saw with particular power, rotational speed, linear speed, repetitions, and/or the like. The processor 1152 may control the saw device 1100 to operate the saw based on computer aided design (CAD) files stored in memory 1156.

The input/output (I/O) port 1162 may be configured to receive signals from any suitably attached electronic device and forward these signals from the analog to digital converter (A/D) 1160 and/or to processor 1152. These signals include signals from the temperature sensor sensing temperature, the position sensor 1112 sensing position, and the like. If the signals are in analog format, the signals may proceed via the analog to digital converter (A/D) 1160. In this regard, the analog to digital converter (A/D) 1160 may be configured to receive analog format signals and convert these signals into corresponding digital format signals.

The controller 1150 may include a digital to analog converter (DAC) 1170 that may be configured to receive digital format signals from the processor 1152, convert these signals to analog format, and forward the analog signals from the input/output (I/O) port 1162. In this manner, electronic devices configured to utilize analog signals may receive communications or be driven by the processor 1152. The processor 1152 may be configured to receive and transmit signals to and from the digital to analog converter (DAC) 1170, A/D 1160 and/or the input/output (I/O) port 1162. The processor 1152 may be further configured to receive time signals from the clock 1158. In addition, the processor 1152 is configured to store and retrieve electronic data to and from the memory 1156 including the CAD files. The controller 1150 may further include a display 1168, an input device 1164, and a read-only memory (ROM) 1172. Finally, the processor 1152 may include a program stored in the memory 1156 executed by the processor 1152 to execute the process of dicing a semiconductor wafer (Block 100) described herein.

FIG. 12 illustrates a schematic of a laser cutting device according to the disclosure.

The laser device 1200 may be implemented using a laser engraving machine, laser patterning system, laser scriber, laser ablation device, or the like to produce the second region 218 in the semiconductor wafer 202. The laser device 1200 may burn or otherwise ablate the semiconductor wafer 202, the substrate 208, any intervening layers, any additional layers, and/or the metallization layer 214 with a focused laser light 1208.

The laser device 1200 may form the second region 218 with the focused laser light 1208 in controlled patterns. The width and depth of the second region 218 may be controllable through pattern generation or pattern recognition, and laser settings on the laser device 1200. The laser device 1200 may have settings that include frequency, power, speed, vector configuration, repetitions, and/or the like. Geometry may be generated directly from computer aided design (CAD) files and imported into the laser device 1200. The line density and repetition settings may be controlled by the laser device 1200 by hardware and/or software.

The laser device 1200 may include a controller 1250 that may receive sensor outputs from a temperature sensor sensing temperature from any part of the associated system. The controller 1250 may receive sensor outputs from a position sensor 1212 that may sense a position of the semiconductor wafer 202 or any other components being processed by the laser device 1200. In one aspect, the position sensor 1212 may sense a position of a support 1214 that is supporting a part of the semiconductor wafer 202 or any other components being processed by the laser device 1200. The controller 1250 may move the support 1214 in order to form the second region 218 in the desired locations of the semiconductor wafer 202 or any other components being processed by the laser device 1200 with a positioning device 1216. The positioning device 1216 may include one or more positioning motors to position the support 1214 at the desired location. The positioning device 1216 may be implemented in numerous other ways. Alternatively, the positioning device 1216 may position the laser device 1200 and the position sensor 1212 may determine the position of the laser device 1200 while the support 1214 is stationary.

The controller 1250 may include a processor 1252. This processor 1252 may be operably connected to a power supply 1254, a memory 1256, a clock 1258, an analog to digital converter (A/D) 1260, an input/output (I/O) port 1262, and the like.

The processor 1252 may control the laser device 1200 to operate the laser to generate a width and depth of the second region 218 through pattern generation. In one aspect, the processor 1252 may control the laser device 1200 to generate a width W2 and depth D2 of the second region 218. The processor 1252 may control the laser device 1200 to operate the laser with particular frequency, power, speed, vector configuration, repetitions, and/or the like. The processor 1252 may control the laser device 1200 to operate the laser based on computer aided design (CAD) files stored in memory 1256.

The input/output (I/O) port 1262 may be configured to receive signals from any suitably attached electronic device and forward these signals from the A/D 1260 and/or to processor 1252. These signal includes signals from the temperature sensor sensing temperature, the position sensor 1212 sensing position, and the like. If the signals are in analog format, the signals may proceed via the analog to digital converter (A/D) 1260. In this regard, the analog to digital converter (A/D) 1260 may be configured to receive analog format signals and convert these signals into corresponding digital format signals.

The controller 1250 may include a digital to analog converter (DAC) 1270 that may be configured to receive digital format signals from the processor 1252, convert these signals to analog format, and forward the analog signals from the input/output (I/O) port 1262. In this manner, electronic devices configured to utilize analog signals may receive communications or be driven by the processor 1252. The processor 1252 may be configured to receive and transmit signals to and from the digital to analog converter (DAC) 1270, the analog to digital converter (A/D) 1260, and/or the input/output (I/O) port 1262. The processor 1252 may be further configured to receive time signals from the clock 1258. In addition, the processor 1252 is configured to store and retrieve electronic data to and from the memory 1256 including the CAD files. The controller 1250 may further include a display 1268, an input device 1264, and a read-only memory (ROM) 1272. Finally, the processor 1252 may include a program stored in the memory 1256 executed by the processor 1252 to execute the process of dicing a semiconductor wafer (Block 100) described herein.

The laser device 1200 may include a gain medium 1204, a mechanism to energize 1206 the gain medium 1204, and a device to provide optical feedback 1210. The gain medium 1204 may be a material with properties that allow it to amplify light by way of stimulated emission. Light of a specific wavelength that passes through the gain medium 1204 may be amplified to increase power. For the gain medium 1204 to amplify light, the gain medium 1204 may be supplied with energy in a pumping process. The energy may be supplied as an electric current or as light at a different wavelength. Pump light may be provided by a flash lamp or by another laser. The laser may implement the optical feedback 1210 with an optical cavity. In one aspect, the feedback may be implemented by a pair of mirrors on either end of the gain medium 1204. Light bounces back and forth between the mirrors, passing through the gain medium 1204 and being amplified each time. Typically, one of the two mirrors, an output coupler, may be partially transparent. Some of the focused laser light 1208 escapes through this mirror and may be focused with a lens 1202 to form the second region 218. However, it should be noted that other implementations of the laser device, laser scriber, and/or laser engraver may be utilized as well.

The disclosure also relates to a process of manufacturing a semiconductor device 222. The process includes depositing and/or pattering materials on and/or in the substrate 208 to form semiconductor devices 222 such as transistors, light emitting diodes (LEDs), diodes, solar cells, and other devices. Thereafter the process of the disclosure includes the process of dicing a semiconductor wafer (Block 100) described herein. Finally, the process of the disclosure includes mounting and encapsulating the individual die to form individual devices.

Figure 13:
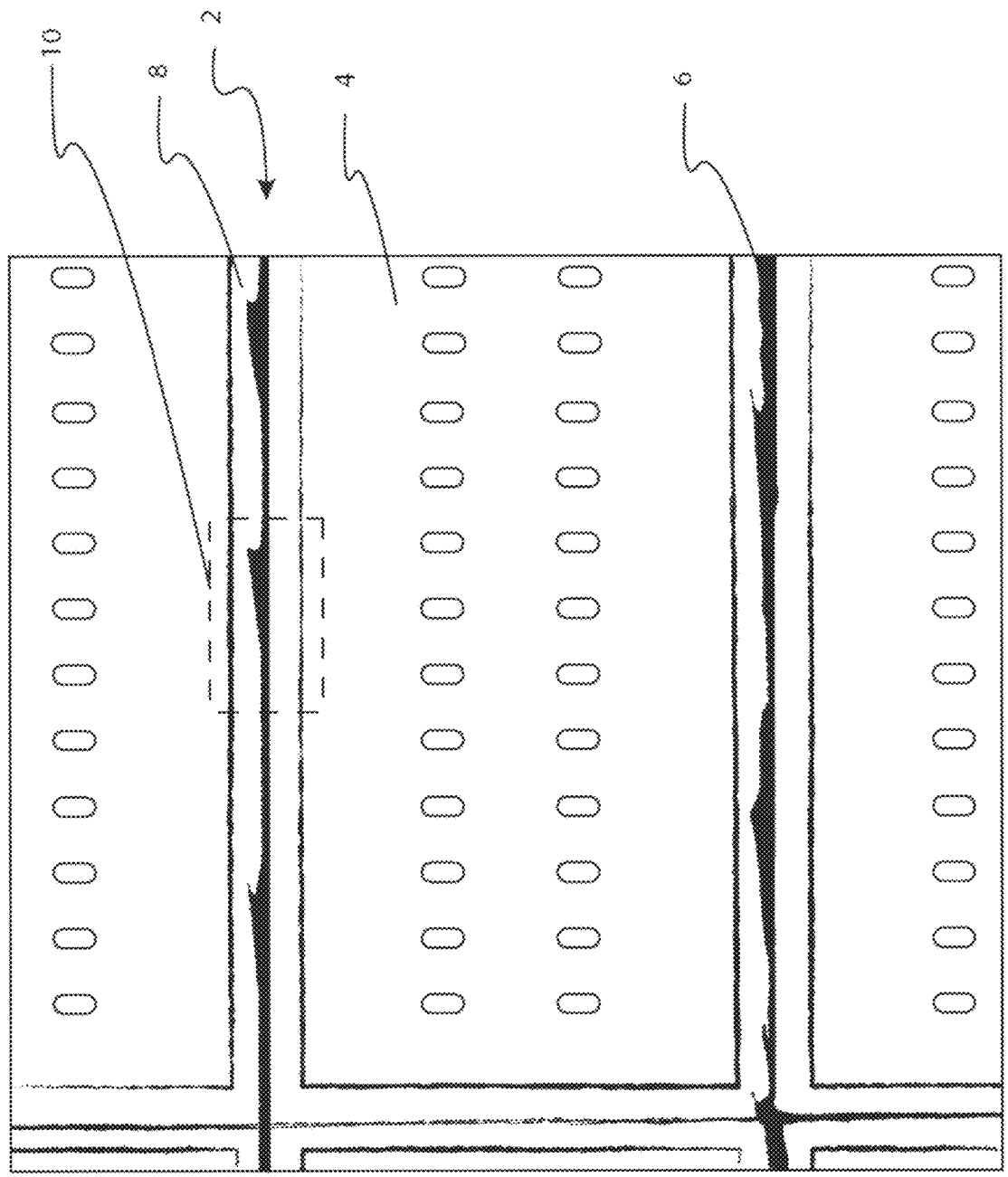
FIG. 13 illustrates a top view of a typical semiconductor wafer after initial processing.

FIG. 13 illustrates a top view of an example semiconductor wafer after initial processing displaying an increased density of dicing defects.

In particular, FIG. 13 illustrates a semiconductor wafer 2 that has been diced with a mechanical saw only to form slots 6 between die 4. As illustrated in FIG. 13, the saw cutting entirely through the semiconductor wafer 2 has formed defects 10 in the form of chips or chip outs. Moreover, because the saw was utilized to cut entirely through the semiconductor wafer 2, streets 8 needed to be formed for the saw cutting process.

In this regard, the disclosure provides unexpected results of utilizing the disclosed process such that there includes no apparent defects or at least a reduced density of defects as illustrated in at least FIG. 7, FIG. 8, FIG. 9, and FIG. 10. In this regard, the disclosed process provides a lower density of defects in comparison to prior art processes, such as the manufacturing process of the device illustrated in FIG. 13.

Accordingly, the disclosure has set forth an alternative solution to dicing semiconductor wafers that results in cleaner dicing, improved semiconductor performance, reduced manufacture time, reduced manufacture costs, and the like. In particular, the disclosure provides unexpected results of utilizing the disclosed process such that there includes no apparent defects or at least a reduced density of defects. Moreover, any metal layers formed on the semiconductor may not have to removed, such as forming streets, and accordingly the ability of the semiconductor device to transfer heat and/or provide die attachment may be improved in comparison to prior art devices.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A die comprising:
a first surface, a second surface, and a device region;
the die comprising a first region that extends partially between the first surface and the second surface along a periphery of the die to a bottom portion of the first region;
the die further comprising a second region between the first surface and the second surface along the periphery of the die that extends from the bottom portion of the first region toward the second surface and the first region is aligned with the second region; and
a metallization layer arranged on the second surface,
wherein the second region extends only partially through the metallization layer,
wherein the first region comprises a saw cut region, the second region comprises a laser ablated region, and a remaining portion of the die comprising a break region, and
wherein the first region has a depth into the die of 50% to 99% of a thickness of the die.

2. The die of claim 1
wherein the first region is structured and arranged by a first implement by sawing the first region into the first surface of the die and the first implement comprises a saw; and
wherein the second region is structured and arranged with a beam of laser light focused between the bottom portion of the first region and the second surface and the beam of laser light is configured to form the second region by material ablation.

3. The die of claim 1 wherein:
the device region comprises a transistor; and
the die comprises silicon carbide.

4. The die of claim 1 wherein the device region comprises a high-electron mobility transistor (HEMT).

5. The die of claim 1 wherein the device region comprises a light emitting diode (LED).

6. The die of claim 1 wherein:
the first region extends partially between the first surface and the second surface along the periphery of the die to reduce an occurrence of non-uniform cuts and/or reduce an occurrence of defects; and
the second region is structured and arranged with a beam of laser light focused at multiple locations between the bottom portion of the first region and the second surface and the beam of laser light is configured to form the second region by material ablation.

7. The die of claim 1 wherein the first region that extends partially between the first surface and the second surface along the periphery of the die that comprises the saw cut region is structured and arranged prior to a formation of the second region that comprises the laser ablated region that is arranged between the first surface and the second surface along the periphery.

8. The die of claim 1
wherein the second region is structured and arranged with a beam of laser light focused at multiple locations between the bottom portion of the first region and the second surface and the beam of laser light is configured to form the second region by material ablation; and
wherein the first region and the second region are structured and arranged one above the other.

9. The die of claim 1
wherein the first region is structured and arranged by a first implement by sawing the first region into the first surface of the die and the first implement comprises a saw;
wherein the second region is structured and arranged with a beam of laser light focused at multiple locations between the bottom portion of the first region and the second surface and the beam of laser light is configured to form the second region by material ablation;
wherein the device region comprises a transistor; and
wherein the die comprises silicon carbide.

10. The die of claim 1
wherein the device region comprises at least one of the following: a high-electron mobility transistor (HEMT) and a light emitting diode (LED);
wherein the first region is structured and arranged by a first implement by sawing the first region into the first surface of the die and the first implement comprises a saw; and
wherein the second region is structured and arranged with a beam of laser light focused at multiple locations between the bottom portion of the first region and the second surface and the beam of laser light is configured to form the second region by material ablation.

11. A die comprising:
a first surface, a second surface, and a device region;
the die comprising a saw cut surface that extends partially between the first surface and the second surface along a periphery of the die to a bottom portion of the saw cut surface;
the die further comprising a laser ablated surface between the first surface and the second surface along the periphery of the die that extends from the bottom portion of the saw cut surface toward the second surface and the saw cut surface is aligned with the laser ablated surface; and
a metallization layer arranged on the second surface,
wherein the laser ablated surface extends only partially through the metallization layer, and a remaining portion of the die comprising a break region; and
wherein the saw cut surface has a depth into the die of 50% to 99% of a thickness of the die.

12. The die of claim 11
wherein the saw cut surface is structured and arranged by a first implement by sawing the saw cut surface into the first surface of the die and the first implement comprises a saw; and
wherein the laser ablated surface is structured and arranged with a beam of laser light focused between the bottom portion of the saw cut surface and the second surface and the beam of laser light is configured to form the laser ablated surface by material ablation.

13. The die of claim 11 wherein the device region comprises at least one of the following: a transistor and a light emitting diode (LED).

14. The die of claim 11 wherein:
the saw cut surface extends partially between the first surface and the second surface along the periphery of the die to reduce an occurrence of non-uniform cuts and/or reduce an occurrence of defects; and
the die comprises silicon carbide.

15. The die of claim 11 wherein the saw cut surface that extends partially between the first surface and the second surface along the periphery of the die is structured and arranged prior to a formation of the laser ablated surface that is arranged between the bottom portion of the saw cut surface and the second surface along the periphery of the die.

16. The die of claim 11
wherein the laser ablated surface is structured and arranged with a beam of laser light focused at multiple locations between the bottom portion of the saw cut surface and the second surface and the beam of laser light is configured to form the laser ablated surface by material ablation; and
wherein the saw cut surface and the laser ablated surface are structured and arranged one above the other.

17. The die of claim 11
wherein the saw cut surface is structured and arranged by a first implement by sawing the saw cut surface into the first surface of the die and the first implement comprises a saw;
wherein the laser ablated surface is structured and arranged with a beam of laser light focused at multiple locations between the bottom portion of the saw cut surface and the second surface and the beam of laser light is configured to form the laser ablated surface by material ablation;
wherein the device region comprises a transistor; and
wherein the die comprises silicon carbide.

18. The die of claim 11
wherein the device region comprises at least one of the following: a high-electron mobility transistor (HEMT) and a light emitting diode (LED);
wherein the saw cut surface is structured and arranged by a first implement by sawing the saw cut surface into the first surface of the die and the first implement comprises a saw; and
wherein the laser ablated surface is structured and arranged with a beam of laser light focused at multiple locations between the bottom portion of the saw cut surface and the second surface and the beam of laser light is configured to form the laser ablated surface by material ablation.

19. A die comprising:
a first surface;
a second surface;
at least a device region;
a substrate;
a saw cut surface that extends partially through the substrate between the first surface and the second surface and the saw cut surface comprises a bottom portion;
a laser ablated surface that extends partially through the substrate between the first surface and the second surface from the bottom portion of the saw cut surface toward the second surface; and
a metallization layer arranged on the second surface,
wherein the laser ablated surface extends only partially through the metallization layer, and a remaining portion of the die comprising a break region,
wherein the saw cut surface is aligned with the laser ablated surface, and
wherein the saw cut surface has a depth into the die of 50% to 99% of a thickness of the die.

20. The die of claim 19 wherein:
a combination of the saw cut surface and the laser ablated surface extend completely through the substrate; and
the substrate comprises silicon carbide.

21. The die of claim 19 wherein:
the device region comprises at least one of the following: a transistor and a light emitting diode (LED); and
the laser ablated surface is structured and arranged with a beam of laser light focused at multiple locations between the bottom portion of the saw cut surface and the second surface and the beam of laser light is configured to form the laser ablated surface by material ablation.

22. The die of claim 19
wherein the saw cut surface is structured and arranged by a first implement by sawing the saw cut surface into the first surface of the die and the first implement comprises a saw;
wherein the laser ablated surface is structured and arranged with a beam of laser light focused at multiple locations between the bottom portion of the saw cut surface and the second surface and the beam of laser light is configured to form the laser ablated surface by material ablation;
wherein the device region comprises a transistor; and
wherein the substrate comprises silicon carbide.

23. The die of claim 19
wherein the device region comprises at least one of the following: a high-electron mobility transistor (HEMT) and a light emitting diode (LED);
wherein the saw cut surface is structured and arranged by a first implement by sawing the saw cut surface into the first surface of the die and the first implement comprises a saw; and
wherein the laser ablated surface is structured and arranged with a beam of laser light focused at multiple locations between the bottom portion of the saw cut surface and the second surface and the beam of laser light is configured to form the laser ablated surface by material ablation.

* * * * *